US010670644B2

United States Patent
Brunel et al.

(10) Patent No.: US 10,670,644 B2
(45) Date of Patent: *Jun. 2, 2020

(54) BEAMFORMING OF HARMONICS

(71) Applicant: Skyworks Solutions, Inc., Woburn, MA (US)

(72) Inventors: Dominique Michel Yves Brunel, Antibes (FR); William J. Domino, Yorba Linda, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/274,564

(22) Filed: Feb. 13, 2019

(65) Prior Publication Data

US 2019/0178927 A1 Jun. 13, 2019

Related U.S. Application Data

(63) Continuation of application No. 15/862,949, filed on Jan. 5, 2018, now Pat. No. 10,236,966.

(Continued)

(51) Int. Cl.
*H04B 7/02* (2018.01)
*G01R 29/10* (2006.01)
(Continued)

(52) U.S. Cl.
CPC ............ *G01R 29/10* (2013.01); *H01Q 1/125* (2013.01); *H01Q 1/246* (2013.01);
(Continued)

(58) Field of Classification Search
CPC .... G01R 29/10; H04B 7/0842; H04B 7/0404; H04B 7/08; H04B 7/0617; H04B 17/17; H01Q 1/246; H01Q 1/125; H04W 24/08
See application file for complete search history.

(56) References Cited

U.S. PATENT DOCUMENTS 6,640,110 B1 10/2003 Shapira et al.
7,505,529 B2 3/2009 Kwak et al.
(Continued)

FOREIGN PATENT DOCUMENTS

WO WO 2008/125929 A2 10/2008

OTHER PUBLICATIONS

International Telecommunication Union, Recommendation ITU-R SM.329-12, Unwanted emissions in the spurious domain, Sep. 2012, in 41 pages.

(Continued)

*Primary Examiner* — Dhaval V Patel
(74) *Attorney, Agent, or Firm* — Knobbe, Martens, Olson & Bear, LLP

(57) ABSTRACT

Apparatus and methods related to beamforming of harmonics are provided herein. In certain implementations, a communications device for operating in a cellular network is provided. The communications device includes a plurality of signal conditioning circuits configured to generate a plurality of transmit signals, an antenna array configured to radiate a transmit beam and including a plurality of antenna elements each thereof operatively associated with a corresponding one of the plurality of signal conditioning circuits, and a beam control circuit configured to control the plurality of signal conditioning circuits to provide beam steering of the transmit beam based on a direction of one or more harmonic lobes of the transmit beam.

20 Claims, 27 Drawing Sheets

Related U.S. Application Data

(60) Provisional application No. 62/443,304, filed on Jan. 6, 2017, provisional application No. 62/509,530, filed on May 22, 2017.

(51) Int. Cl.

| | | |
|---|---|---|
| *H04B 7/06* | (2006.01) | |
| *H01Q 1/24* | (2006.01) | |
| *H01Q 1/12* | (2006.01) | |
| *H04B 17/17* | (2015.01) | |
| *H04W 24/08* | (2009.01) | |
| *H04B 7/0404* | (2017.01) | |
| *H04B 7/08* | (2006.01) | |

(52) U.S. Cl.
CPC ......... *H04B 7/0404* (2013.01); *H04B 7/0617* (2013.01); *H04B 7/08* (2013.01); *H04B 7/0842* (2013.01); *H04B 17/17* (2015.01); *H04W 24/08* (2013.01)

(56) References Cited

U.S. PATENT DOCUMENTS

| | | | | |
|---|---|---|---|---|
| 7,728,769 B2* | 6/2010 | Chang | ................ | G01S 7/414 |
| | | | | 342/360 |
| 8,681,890 B2 | 3/2014 | Petrovic | | |
| 9,042,323 B1* | 5/2015 | Marupaduga | ........ | H04B 7/0602 |
| | | | | 370/329 |
| 10,145,878 B2 | 12/2018 | Brunel et al. | | |
| 10,236,966 B2 | 3/2019 | Brunel et al. | | |
| 2005/0101865 A1 | 5/2005 | Hao et al. | | |
| 2005/0232182 A1 | 10/2005 | Shattil | | |
| 2010/0165952 A1 | 7/2010 | Sung et al. | | |
| 2011/0084887 A1 | 4/2011 | Mow et al. | | |
| 2013/0278463 A1 | 10/2013 | Nilsson et al. | | |
| 2014/0266893 A1* | 9/2014 | Rasheed | ................ | H04B 7/086 |
| | | | | 342/367 |
| 2016/0036125 A1* | 2/2016 | Gupta | ................ | H01Q 3/2605 |
| | | | | 342/369 |
| 2016/0380354 A1 | 12/2016 | Bozier et al. | | |
| 2016/0380360 A1 | 12/2016 | Guener et al. | | |

OTHER PUBLICATIONS

Karjalainen, Juha, "On Multi-Antenna Transceivers for mm-wave 5G" Samsung Electronics, R&D UK/Finland, 5G New Air Interfaces, IEEE Globecom Industry Workshop 2014, Austin, USA, in 10 pages.

Kim, et al., "Tens of Gbps Support with mmWave Beamforming Systems for Next Generation Communications," Globecom 2013—Wireless Communications Symposium, IEEE 2013, in 6 pages.

Rajagopal et al., "Power Efficient Signal Processing for mmWave 5G Systems" J Sign Process Syst (2016) 83: 177-190, in 14 pages.

International Search Report and Written Opinion of the International Searching Authority for International Application No. PCT/US2018/012637 dated Jun. 7, 2018, in 13 pages.

* cited by examiner

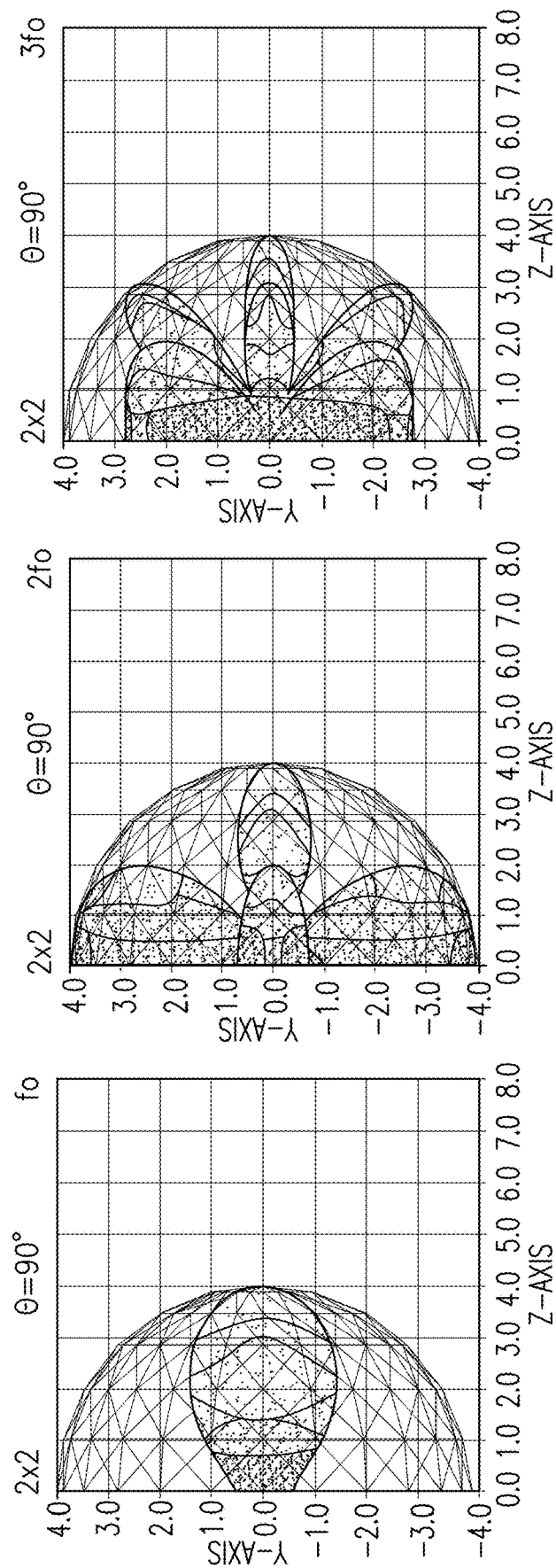

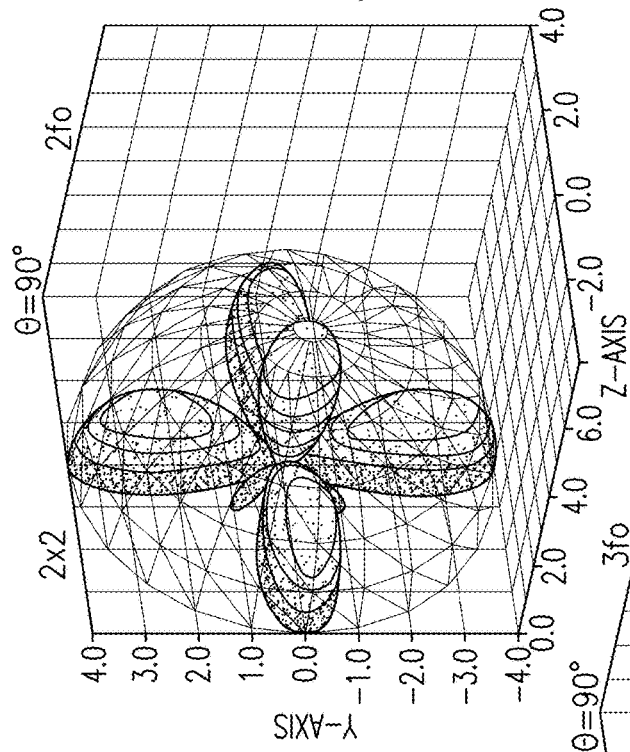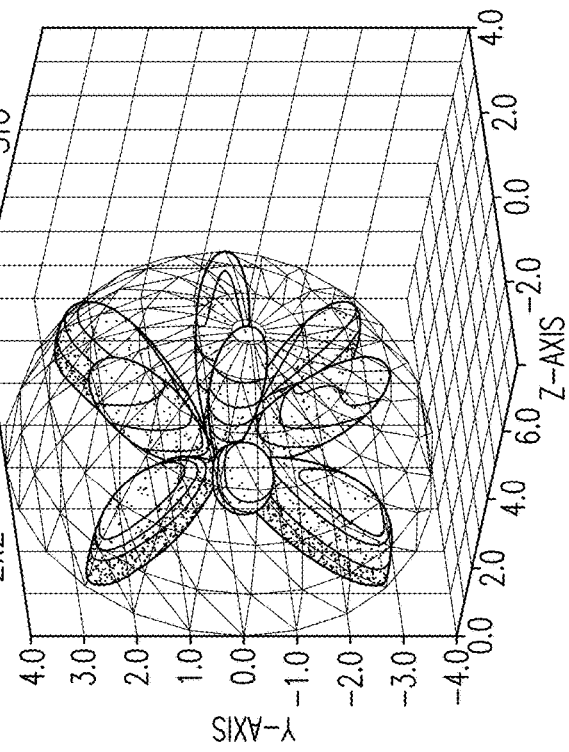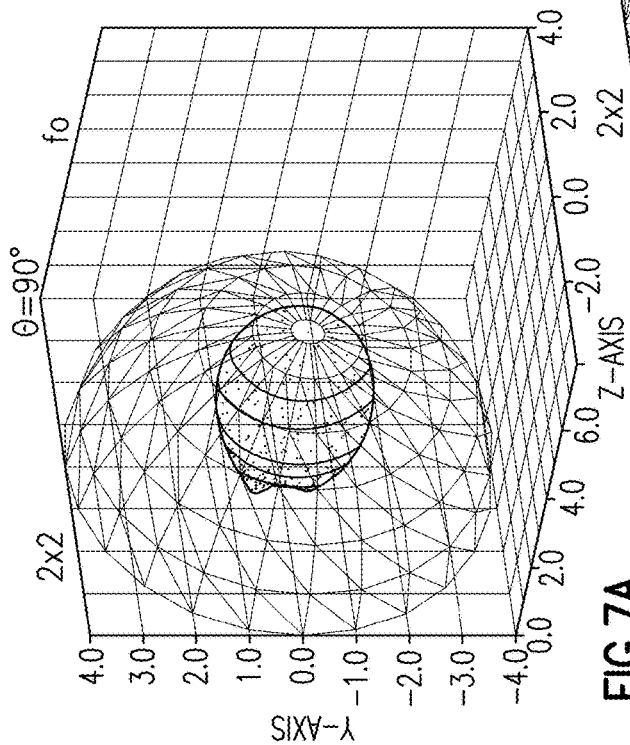

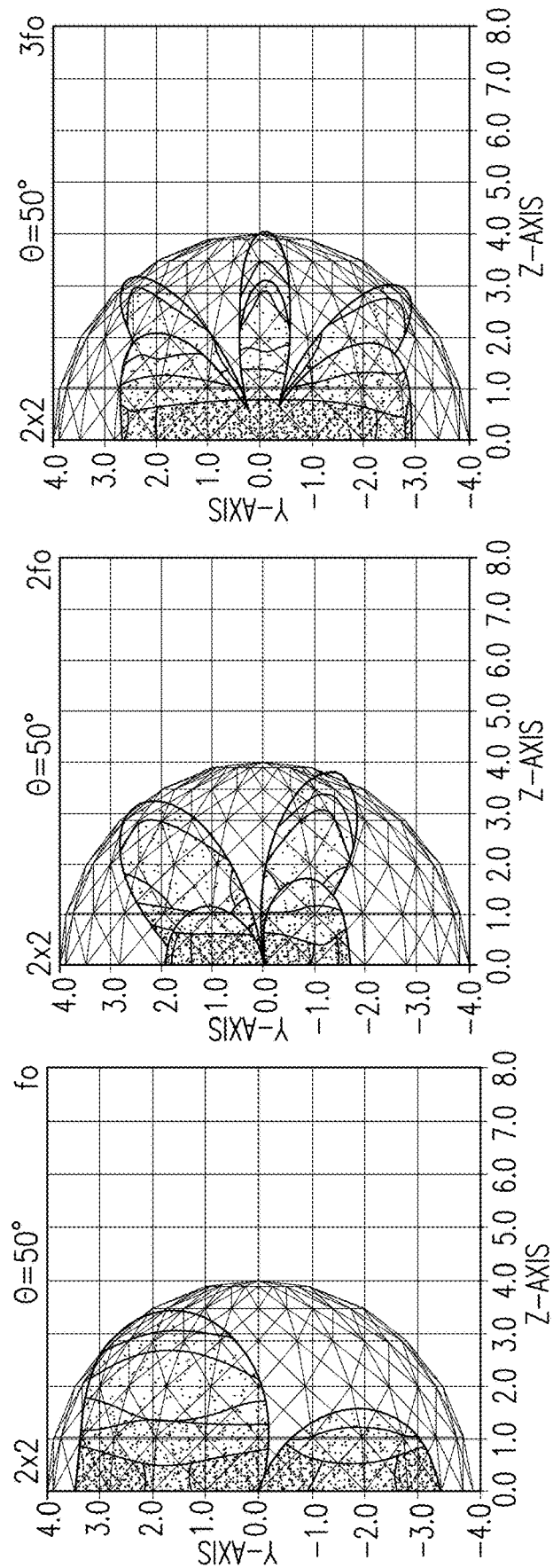

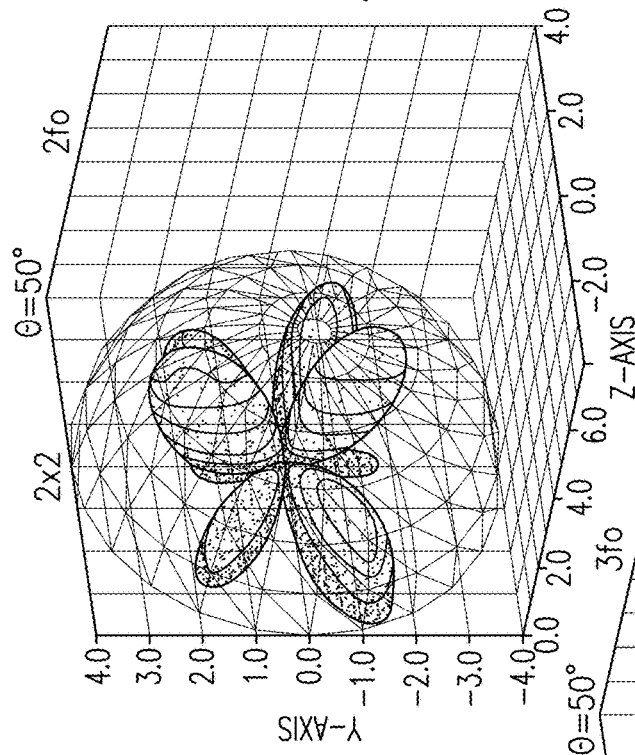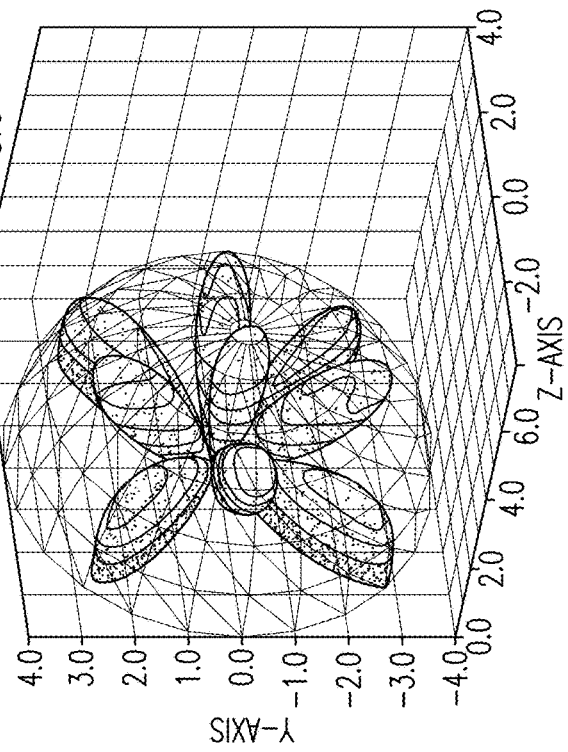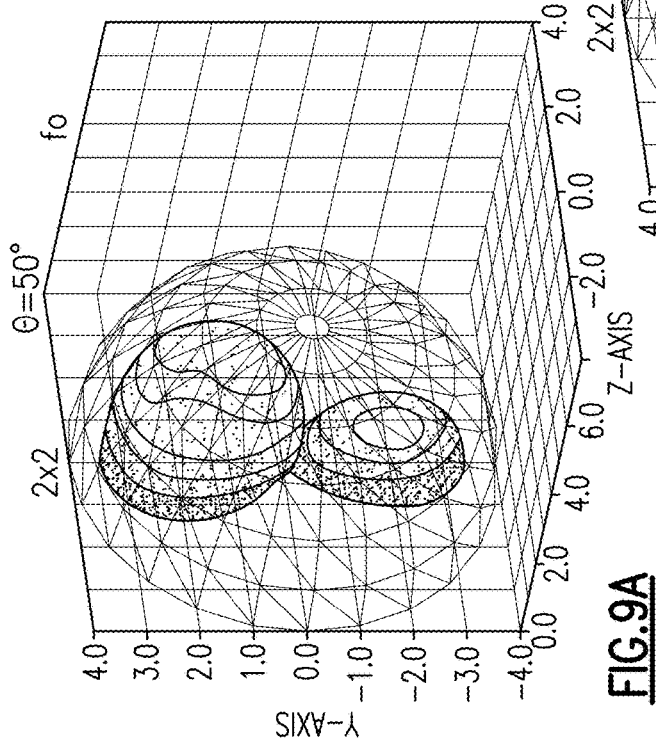

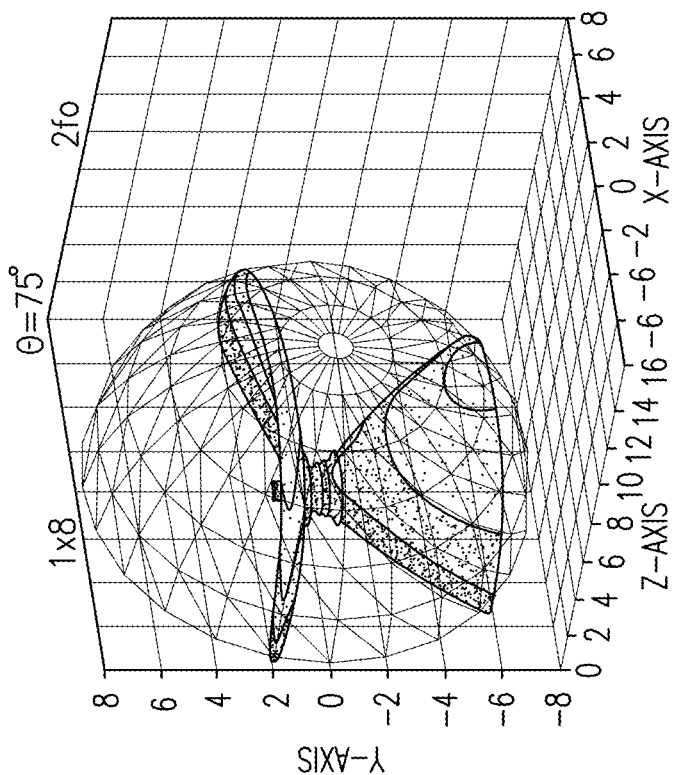
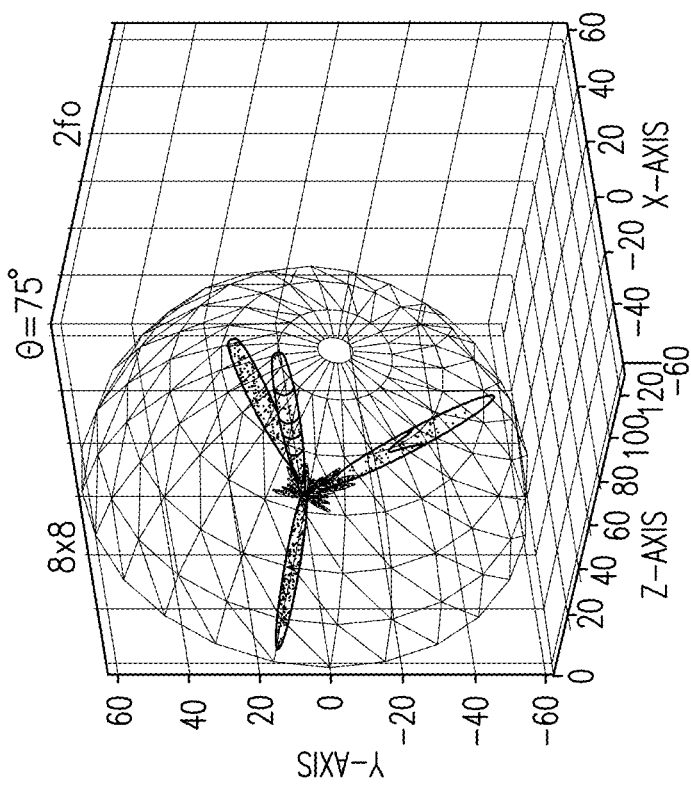
FIG. 16B
FIG. 16A

BEAMFORMING OF HARMONICS

CROSS-REFERENCE TO RELATED APPLICATIONS

This application is a continuation of U.S. application Ser. No. 15/862,949, filed Jan. 5, 2018, titled "BEAMFORMING OF HARMONICS," which claims the benefit of priority under 35 U.S.C. § 119 of U.S. Provisional Patent Application No. 62/509,530, filed May 22, 2017 and titled "BEAMFORMING OF HARMONICS," and of U.S. Provisional Patent Application No. 62/443,304, filed Jan. 6, 2017 and titled "BEAMFORMING OF HARMONICS," each of which is herein incorporated by reference in its entirety.

BACKGROUND

Field

Embodiments of the invention relate to electronic systems, and in particular, to radio frequency (RF) electronics.

Description of Related Technology

A radio frequency (RF) communication system can include a transceiver, a front end, and one or more antennas for wirelessly transmitting and/or receiving signals. The front end can include low noise amplifier(s) for amplifying relatively weak signals received via the antenna(s) and power amplifier(s) for boosting signals for transmission via the antenna(s).

Examples of RF communication systems include, but are not limited to, mobile phones, tablets, base stations, network access points, customer-premises equipment (CPE), laptops, and wearable electronics.

SUMMARY

In certain embodiments, the present disclosure relates to a radio frequency system for use in a cellular network. The radio frequency system includes an antenna array including a plurality of antenna elements configured to generate a plurality of receive signals in response to a radio wave, each of the plurality of antenna elements configured to generate a corresponding one of the plurality of receive signals, a plurality of signal conditioning circuits each thereof operatively associated with a corresponding one of the plurality of antenna elements, the plurality of signal conditioning circuits configured to process the plurality of receive signals to thereby form a receive beam, and a beam control circuit configured to control the plurality of signal conditioning circuits to provide beam steering of the receive beam based on a direction of one or more harmonic lobes of the receive beam.

In some embodiments, the beam control circuit is further configured to detune a fundamental lobe of the receive beam based on the direction of one or more harmonic lobes. According to a number of embodiments, the one or more harmonic lobes includes a harmonic lobe pointed in substantially the same direction as the fundamental lobe and having a narrower beam width than the fundamental lobe. In accordance with various embodiments, the beam control circuit is further configured to steer the receive beam inside a beam width of the fundamental lobe but outside a beam width of the one or more harmonic lobes.

In several embodiments, the beam control circuit is operable to regularly adjust an angle of the receive beam.

In various embodiments, at least one of the plurality of signal conditioning circuits includes a harmonic power detector configured to detect a harmonic power level, the beam control circuit further configured to provide beam steering based on the harmonic power level.

In a number of embodiments, the radio frequency system further includes a harmonic power detector configured to detect a harmonic power level of the receive beam, the beam control circuit further configured to provide beam steering based on the harmonic power level.

In some embodiments, each of the plurality of signal conditioning circuits includes a variable phase shifter controlled by the beam control circuit.

In several embodiments, the plurality of antenna elements includes at least one of a plurality of patch antenna elements, a plurality of dipole antenna elements, a plurality of ceramic resonators, a plurality of stamped metal antennas, or a plurality of laser direct structuring antennas.

In certain embodiments, the present disclosure relates to a module for implementation in user equipment for use in a cellular network. The module includes a laminated substrate, an antenna array formed on the laminated substrate and including a plurality of antenna elements configured to generate a plurality of receive signals in response to a radio wave, each of the plurality of antenna elements configured to generate a corresponding one of the plurality of receive signals, and a semiconductor die attached to the laminated substrate. The semiconductor die includes a plurality of signal conditioning circuits each thereof operatively associated with a corresponding one of the plurality of antenna elements, the plurality of signal conditioning circuits configured to process the plurality of receive signals to thereby form a receive beam. The semiconductor die further includes a beam control circuit configured to control the plurality of signal conditioning circuits to provide beam steering of the receive beam based on a direction of one or more harmonic lobes of the receive beam.

In several embodiments, the beam control circuit is further configured to detune a fundamental lobe of the receive beam based on the direction of one or more harmonic lobes. According to some embodiments, the one or more harmonic lobes include a harmonic lobe pointed in substantially the same direction as the fundamental lobe and having a narrower beam width than the fundamental lobe. In accordance with various embodiments, the beam control circuit is further configured to steer the receive beam inside a beam width of the fundamental lobe but outside a beam width of the one or more harmonic lobes.

In a number of embodiments, the beam control circuit is operable to regularly adjust an angle of the receive beam.

In various embodiments, at least one of the plurality of signal conditioning circuits includes a harmonic power detector configured to detect a harmonic power level, the beam control circuit further configured to provide beam steering based on the harmonic power level.

In some embodiments, the module further includes a harmonic power detector configured to detect a harmonic power level of the receive beam, the beam control circuit further configured to provide beam steering based on the harmonic power level.

In several embodiments, each of the plurality of signal conditioning circuits include a variable phase shifter controlled by the beam control circuit.

In certain embodiments, the present disclosure relates to a method of beam control in a radio frequency system. The method includes receiving a plurality of receive signals on a plurality of antenna elements of an antenna array, each of the plurality of receive signals received by a corresponding one of the plurality of antenna elements, conditioning the plurality of receive signals using a plurality of signal conditioning circuits each thereof operatively associated with a corresponding one of the plurality of antenna elements, generating a receive beam by processing the plurality of receive signals using the plurality of signal conditioning circuits, and steering the receive beam in a selected direction based on a direction of one or more harmonic lobes of the receive beam.

In several embodiments, the method further includes detuning a fundamental lobe of the receive beam based on the direction of one or more harmonic lobes. In a number of embodiments, the method further includes steering the receive beam inside a beam width of the fundamental lobe but outside a beam width of each of the one or more harmonic lobes.

In certain embodiments, the present disclosure relates to a method of harmonic testing of cellular communication assemblies for emissions compliance. The method includes transmitting a signal beam using an antenna array of a respective cellular communication assembly after manufacture thereof, the signal beam including a fundamental lobe and one or more harmonic lobes, determining one or more testing locations of the signal beam based on detecting a direction of the fundamental lobe using test equipment, the one or more testing locations corresponding to locations associated with the one or more harmonic lobes, evaluating a level of harmonic emissions at each of the one or more testing locations using the test equipment, and establishing that the respective cellular communication assembly complies with emissions testing when the level of harmonic emissions at each tested location is determined to be below a predetermined threshold.

In several embodiments, when the level of harmonic emissions at one or more of the tested locations is determined to be above the predetermined threshold, the respective cellular communication assembly is established to not be in compliance with emissions testing.

In some embodiments, the method further includes omitting testing at positions away from the one or more harmonic lobes.

In various embodiments, the harmonic testing includes spurious emission testing.

In a number of embodiments, the harmonic testing includes detecting second harmonic emissions from the respective cellular communication assembly.

In several embodiments, the harmonic testing includes detecting third harmonic emissions from the respective cellular communication assembly.

In some embodiments, the method is implemented using automated test equipment.

In certain embodiments, the present disclosure relates to automated test equipment for harmonic testing of cellular communication assemblies for emissions compliance. The automated test equipment includes one or more measurement antennas configured to generate a receive signal in response to receiving a signal beam transmitted from an antenna array of a cellular communication assembly, the signal beam comprising a fundamental lobe and one or more harmonic lobes, a signal analyzer configured to analyze the receive signal to detect a direction of the fundamental lobe, and a testing location determination system configured to determine one or more testing locations of the signal beam based on the detected direction of the fundamental lobe, the one or more testing locations corresponding to locations associated with the one or more harmonic lobes. The testing location determination system is further configured to control the automated test equipment to evaluate a level of harmonic emissions at each of the one or more testing locations.

In a number of embodiments, the automated test equipment is further configured to compare the level of harmonic emissions at each of the one or more testing locations to a predetermined threshold.

In some embodiments, the automated test equipment further includes a handler configured to move the cellular communication assembly.

In several embodiments, the automated test equipment further includes a platform configured to receive the cellular communication assembly, the platform configured to be at least one of movable or rotatable relative to the one or more measurement antennas.

In various embodiments, the one or more measurement antennas are implemented to be at least one of movable or rotatable with respect to the cellular communication assembly.

In a number of embodiments, the testing location determination system is further configured to omit testing at positions away from the one or more harmonic lobes.

In certain embodiments, the present disclosure relates to a method of harmonic testing of cellular communication assemblies using automated test equipment. The method includes generating a receive signal using one or more measurement antennas of the automated test equipment in response to receiving a signal beam from an antenna array of a cellular communication assembly, the signal beam comprising a fundamental lobe and one or more harmonic lobes, analyzing the receive signal to detect a direction of the fundamental lobe using a signal analyzer of the automated test equipment, determining one or more testing locations of the signal beam based on the detected direction of the fundamental lobe using a testing location determination system of the automated test equipment, the one or more testing locations corresponding to locations associated with the one or more harmonic lobes, and evaluating a level of harmonic emissions at each of the one or more testing locations using the automated test equipment.

In several embodiments, the method further includes comparing the level of harmonic emissions at each of the one or more testing locations to a predetermined threshold.

In a number of embodiments, the method further includes moving the cellular communication assembly onto a testing platform using a handler of the automated test equipment.

In various embodiments, the method further includes at least one of moving or rotating the testing platform to control a relative position between the cellular communication assembly and the one or more measurement antennas.

In several embodiments, the method further includes at least one of moving or rotating the one or more measurement antennas to control a relative position between the cellular communication assembly and the one or more measurement antennas.

In some embodiments, the method further includes omitting testing at positions away from the one or more harmonic lobes.

In a number of embodiments, evaluating the level of harmonic emissions includes evaluating at least one of second harmonic emissions or third harmonic emissions of the cellular communication assembly.

In certain embodiments, a communications device for a wireless network is provided. The communication device includes an antenna array including a plurality of antenna elements, a plurality of signal conditioning circuits operatively associated with the plurality of antenna elements, and a beam control circuit configured to control the plurality of signal conditioning circuits so as to dynamically manage a beam formed by the antenna array, the beam control circuit operable to control a direction of the beam based on at least one consideration related to one or more harmonic lobes of the beam.

In several embodiments, the beam control circuit is operable to control the direction of the beam based on a location of the one or more harmonic lobes relative to at least one other communications device of the wireless network.

In a number of embodiments, the one or more harmonic lobes include a primary harmonic lobe pointing in substantially the same direction as a fundamental lobe of the beam, the primary harmonic lobe having a narrower beam width than the fundamental lobe. In accordance with various embodiments, the beam control circuit is operable to steer the direction of the beam such that another communications device of the wireless network is inside a beam width of the fundamental lobe but outside a beam width of the primary harmonic lobe.

In some embodiments, the beam control circuit is further operable to control a strength of the beam.

In various embodiments, each of the plurality of signal conditioning circuits include a variable phase shifter in cascade with a power amplifier.

In a number of embodiments, the plurality of antenna elements includes a plurality of patch antenna elements.

In several embodiments, the beam control circuit is operable to regularly update the direction of the beam.

In various embodiments, the beam control circuit receives one or more inputs indicative of at least one of a communication link of the antenna array or an operating environment of the communications device. In accordance with some embodiments, the one or more inputs includes an indicator of geo-positioning of at least one other communications device in the wireless network. According to several embodiments, the one or more inputs includes an achieved data rate of the communication link. In accordance with a number of embodiments, the one or more inputs includes an observed error rate of the communication link. According to some embodiments, the one or more inputs includes a receive signal strength indicator. In accordance with several embodiments, the one or more inputs includes an indicator of a blocker signal level.

In a number of embodiments, the one or more harmonic lobes includes a second harmonic lobe.

In several embodiments, the one or more harmonic lobes includes a third harmonic lobe.

In certain embodiments, the present disclosure relates to a module for a communications device of a wireless network. The module includes a laminate, an antenna array formed on a first surface of the laminate and including a plurality of antenna elements, and one or more semiconductor dies on a second surface of the laminate opposite the first surface, the one or more semiconductor dies including a plurality of signal conditioning circuits operatively associated with the plurality of antenna elements, and a beam control circuit configured to control the plurality of signal conditioning circuits so as to dynamically manage a beam formed by the antenna array. The beam control circuit is operable to control a direction of the beam based on at least one consideration related to one or more harmonic lobes of the beam.

In various embodiments, the beam control circuit is operable to control the direction of the beam based on a location of the one or more harmonic lobes relative to at least one other communications device of the wireless network.

In several embodiments, the one or more harmonic lobes include a primary harmonic lobe pointing in substantially the same direction as a fundamental lobe of the beam, the primary harmonic lobe having a narrower beam width than the fundamental lobe. According to a number of embodiments, the beam control circuit is operable to steer the direction of the beam such that another communications device of the wireless network is inside a beam width of the fundamental lobe but outside a beam width of the primary harmonic lobe.

In various embodiments, the beam control circuit is further operable to control a strength of the beam.

In some embodiments, each of the plurality of signal conditioning circuits include a variable phase shifter in cascade with a power amplifier.

In several embodiments, the plurality of antenna elements includes a plurality of patch antenna elements.

In a number of embodiments, the beam control circuit is operable to regularly update the direction of the beam.

In various embodiments, the beam control circuit receives one or more inputs indicative of at least one of a communication link of the antenna array or an operating environment of the communications device. In accordance with some embodiments, the one or more inputs includes an indicator of geo-positioning of at least one other communications device in the wireless network. According to several embodiments, the one or more inputs includes an achieved data rate of the communication link. In accordance with a number of embodiments, the one or more inputs includes an observed error rate of the communication link. According to some embodiments, the one or more inputs includes a receive signal strength indicator. In accordance with several embodiments, the one or more inputs includes an indicator of a blocker signal level.

In some embodiments, the one or more harmonic lobes includes a second harmonic lobe.

In several embodiments, the one or more harmonic lobes includes a third harmonic lobe.

In certain embodiments, the present disclosure relates to a method of dynamic beam control in a communications device of a wireless network. The method includes conditioning a plurality of transmit signals using a plurality of signal conditioning circuits, generating a beam by beamforming the plurality of transmit signals using a plurality of antenna elements of an antenna array, and dynamically controlling a direction of the beam using a beam control circuit based on at least one consideration related to one or more harmonic lobes of the beam.

In various embodiments, dynamically controlling the direction of the beam includes steering the beam based on a location of the one or more harmonic lobes relative to at least one other communications device of the wireless network.

In several embodiments, the one or more harmonic lobes include a primary harmonic lobe pointing in substantially the same direction as a fundamental lobe of the beam, the primary harmonic lobe having a narrower beam width than the fundamental lobe. In accordance with various embodiments, dynamically controlling the direction of the beam includes steering the beam such that another communications device of the wireless network is inside a beam width of the fundamental lobe but outside a beam width of the primary harmonic lobe.

In a number of embodiments, the method further includes controlling a strength of the beam using the beam control circuit.

In several embodiments, the method further includes regularly updating the direction of the beam using the beam control circuit.

In various embodiments, the method further includes receiving one or more inputs to the beam control circuit, the one or more indicative of at least one of a communication link of the antenna array or an operating environment of the communications device. In accordance with some embodiments, the one or more inputs includes an indicator of geo-positioning of at least one other communications device in the wireless network. According to several embodiments, the one or more inputs includes an achieved data rate of the communication link. In accordance with a number of embodiments, the one or more inputs includes an observed error rate of the communication link. According to some embodiments, the one or more inputs includes a receive signal strength indicator. In accordance with several embodiments, the one or more inputs includes an indicator of a blocker signal level.

In a number of embodiments, the one or more harmonic lobes includes a second harmonic lobe.

In several embodiments, the one or more harmonic lobes includes a third harmonic lobe.

In certain embodiments, the present disclosure relates to a communications device for a wireless network. The communication device includes one or more antennas configured to receive a signal beam from another communications device of the wireless network over a communications link, the signal beam including a fundamental beam and one or more harmonic beams generated by beamforming, and a receiver configured to process the fundamental beam to receive data over the communications link, the receiver further operable to assess one or more characteristics of the communications link based on at least one harmonic beam that points in in substantially the same direction as the fundamental beam.

In certain embodiments, the present disclosure relates to a method of harmonic testing. The method includes beamforming a signal beam using an antenna array of a communications device, determining a location of one or more harmonic lobes of the signal beam based on a direction of a fundamental lobe of the signal beam, and performing harmonic testing at one or more testing locations based on the determination.

In some embodiments, the method further includes omitting testing at positions away from the one or more harmonic lobes.

In a number of embodiments, the harmonic testing includes spurious emission testing.

In several embodiments, the harmonic testing includes detecting second harmonic emissions from the communications device.

In various embodiments, the harmonic testing includes detecting third harmonic emissions from the communications device.

In some embodiments, the method is implemented using automated test equipment.

In certain embodiments, the present disclosure relates to a communication device for operating as user equipment in a wireless network. The communication device includes an antenna array including a plurality of antenna elements configured to generate a plurality of receive signals in response to a radio wave, a plurality of signal conditioning circuits operatively associated with the plurality of antenna elements and configured to condition the plurality of receive signals to provide beamforming of a receive beam, and a beam control circuit configured to control the plurality of signal conditioning circuits to provide beam steering of the receive beam based on a direction of one or more harmonic lobes of the receive beam.

In various embodiments, the beam control circuit is further configured to detune a fundamental lobe of the receive beam based on the direction of one or more harmonic lobes. In accordance with several embodiments, the one or more harmonic lobes includes a harmonic lobe pointed in substantially the same direction as the fundamental lobe and having a narrower beam width than the fundamental lobe. According to some embodiments, the beam control circuit is further configured to steer the receive beam such that another communication device of the wireless network is inside a beam width of the fundamental lobe but outside a beam width of the harmonic lobe.

In a number of embodiments, the beam control circuit is operable to control the direction of the beam based on a location of the one or more harmonic lobes relative to at least one other communication device of the wireless network.

In several embodiments, the beam control circuit is operable to regularly adjust an angle of the receive beam.

In various embodiments, the beam control circuit further controls beam steering based on one or more input signals indicating at least one of a communication link of the antenna array or an operating environment of the communication device. In accordance with a number of embodiments, the one or more inputs includes an indicator of geo-positioning of at least one other communication device in the wireless network. According to some embodiments, the one or more inputs includes an achieved data rate of the communication link. In accordance with several embodiments, the one or more inputs includes an observed error rate of the communication link. According to a number of embodiments, the one or more inputs includes a receive signal strength indicator. In accordance with some embodiments, the one or more inputs includes an indicator of a blocker signal level.

In some embodiments, the one or more harmonic lobes includes a second harmonic lobe.

In several embodiments, the one or more harmonic lobes includes a third harmonic lobe.

In a number of embodiments, each of the plurality of signal conditioning circuits include a variable phase shifter controlled by the beam control circuit.

In various embodiments, the antenna array is implemented as a linear array.

In some embodiments, the antenna array is implemented as a multi-dimensional array.

In several embodiments, the radio wave has a frequency of at least 10 GHz. In accordance with various embodiments, the radio wave has a frequency of at least 24 GHz.

In a number of embodiments, the plurality of antenna elements includes a plurality of patch antenna elements, a plurality of dipole antenna elements, a plurality of ceramic resonators, a plurality of stamped metal antennas, or a plurality of laser direct structuring antennas.

In certain embodiments, the present disclosure relates to a module for a communication device of a wireless network. The module includes a laminated substrate, an antenna array formed on a first surface of the laminated substrate and including a plurality of antenna elements configured to generate a plurality of receive signals in response to a radio wave, and one or more semiconductor dies attached to the laminated substrate. The one or more semiconductor dies includes a plurality of signal conditioning circuits operatively associated with the plurality of antenna elements and configured to condition the plurality of receive signals to provide beamforming of a receive beam, and a beam control circuit configured to control the plurality of signal conditioning circuits to provide beam steering of the receive beam based on a direction of one or more harmonic lobes of the receive beam.

In several embodiments, the one or more semiconductor dies includes at least one die on a second surface of the laminated substrate opposite the first surface.

In a number of embodiments, the one or more semiconductor dies includes at least one die internal to the laminated substrate.

In various embodiments, the beam control circuit is further configured to detune a fundamental lobe of the receive beam based on the direction of one or more harmonic lobes. In accordance with some embodiments, the one or more harmonic lobes includes a harmonic lobe pointed in substantially the same direction as the fundamental lobe and having a narrower beam width than the fundamental lobe. According to several embodiments, the beam control circuit is further configured to steer the receive beam such that another communication device of the wireless network is inside a beam width of the fundamental lobe but outside a beam width of the harmonic lobe.

In several embodiments, the beam control circuit is operable to regularly adjust an angle of the receive beam.

In some embodiments, the beam control circuit further controls beam steering based on one or more input signals indicating at least one of a communication link of the antenna array or an operating environment of the communication device. In accordance with a number of embodiments, the one or more inputs includes an indicator of geo-positioning of at least one other communication device in the wireless network. According to several embodiments, the one or more inputs includes an achieved data rate of the communication link. In accordance with various embodiments, the one or more inputs includes an observed error rate of the communication link. According to a number of embodiments, the one or more inputs includes a receive signal strength indicator. In accordance with several embodiments, the one or more inputs includes an indicator of a blocker signal level.

In several embodiments, the one or more harmonic lobes includes a second harmonic lobe.

In a number of embodiments, the one or more harmonic lobes includes a third harmonic lobe.

In various embodiments, each of the plurality of signal conditioning circuits include a variable phase shifter controlled by the beam control circuit.

In some embodiments, the antenna array is implemented as a linear array.

In a number of embodiments, the antenna array is implemented as a multi-dimensional array.

In several embodiments, the radio wave has a frequency of at least 10 GHz. According to various embodiments, the radio wave has a frequency of at least 24 GHz.

In some embodiments, the plurality of antenna elements includes a plurality of patch antenna elements, a plurality of dipole antenna elements, a plurality of ceramic resonators, a plurality of stamped metal antennas, or a plurality of laser direct structuring antennas.

In certain embodiments, the present disclosure relates to a base station for a wireless network. The base station includes an antenna array including a plurality of antenna elements configured to generate a plurality of receive signals in response to a radio wave, a plurality of signal conditioning circuits operatively associated with the plurality of antenna elements and configured to condition the plurality of receive signals to provide beamforming of a receive beam, and a beam control circuit configured to control the plurality of signal conditioning circuits to provide beam steering of the receive beam based on a direction of one or more harmonic lobes of the receive beam.

In various embodiments, the beam control circuit is further configured to detune a fundamental lobe of the receive beam based on the direction of one or more harmonic lobes. In accordance with several embodiments, the one or more harmonic lobes includes a harmonic lobe pointed in substantially the same direction as the fundamental lobe and having a narrower beam width than the fundamental lobe.

In several embodiments, the beam control circuit is operable to regularly adjust an angle of the receive beam.

In various embodiments, the beam control circuit further controls beam steering based on one or more input signals indicating at least one of a communication link of the antenna array or an operating environment of the base station. In accordance with a number of embodiments, the one or more inputs includes an indicator of geo-positioning of at least one communication device in the wireless network. According to some embodiments, the one or more inputs includes an achieved data rate of the communication link. In accordance with several embodiments, the one or more inputs includes an observed error rate of the communication link. According to a number of embodiments, the one or more inputs includes a receive signal strength indicator. In accordance with some embodiments, the one or more inputs includes an indicator of a blocker signal level.

In some embodiments, the one or more harmonic lobes includes a second harmonic lobe.

In several embodiments, the one or more harmonic lobes includes a third harmonic lobe.

In a number of embodiments, each of the plurality of signal conditioning circuits include a variable phase shifter controlled by the beam control circuit.

In various embodiments, the antenna array is implemented as a linear array.

In some embodiments, the antenna array is implemented as a multi-dimensional array.

In several embodiments, the radio wave has a frequency of at least 10 GHz. In accordance with various embodiments, the radio wave has a frequency of at least 24 GHz.

In a number of embodiments, the plurality of antenna elements includes a plurality of patch antenna elements, a plurality of dipole antenna elements, a plurality of ceramic resonators, a plurality of stamped metal antennas, or a plurality of laser direct structuring antennas.

In some embodiments, the radio wave has a frequency of less than 6 GHz.

BRIEF DESCRIPTION OF THE DRAWINGS

Embodiments of this disclosure will now be described, by way of non-limiting example, with reference to the accompanying drawings.

FIG. 6A is a two-dimensional graph of simulation results for one example of fundamental beamforming at 90° using a 2×2 antenna array.

FIG. 6B is a two-dimensional graph of simulation results for one example of second harmonic beamforming at 90° using a 2×2 antenna array.

FIG. 6C is a two-dimensional graph of simulation results for one example of third harmonic beamforming at 90° using a 2×2 antenna array.

FIG. 7A is a three-dimensional graph of simulation results for one example of fundamental beamforming at 90° using a 2×2 antenna array.

FIG. 7B is a three-dimensional of simulation results for one example of second harmonic beamforming at 90° using a 2×2 antenna array.

FIG. 7C is a three-dimensional of simulation results for one example of third harmonic beamforming at 90° using a 2×2 antenna array.

FIG. 8A is a two-dimensional graph of simulation results for one example of fundamental beamforming at 50° using a 2×2 antenna array.

FIG. 8B is a two-dimensional graph of simulation results for one example of second harmonic beamforming at 50° using a 2×2 antenna array.

FIG. 8C is a two-dimensional graph of simulation results for one example of third harmonic beamforming at 50° using a 2×2 antenna array.

FIG. 9A is a three-dimensional graph of simulation results for one example of fundamental beamforming at 50° using a 2×2 antenna array.

FIG. 9B is a three-dimensional of simulation results for one example of second harmonic beamforming at 50° using a 2×2 antenna array.

FIG. 9C is a three-dimensional of simulation results for one example of third harmonic beamforming at 50° using a 2×2 antenna array.

FIG. 16A is a three-dimensional graph of simulation results for one example of second harmonic beamforming at 75° using an 8×8 antenna array.

FIG. 16B is a three-dimensional graph of simulation results for one example of second harmonic beamforming at 75° using a 1×8 antenna array.

DETAILED DESCRIPTION OF CERTAIN EMBODIMENTS

Figure 1:
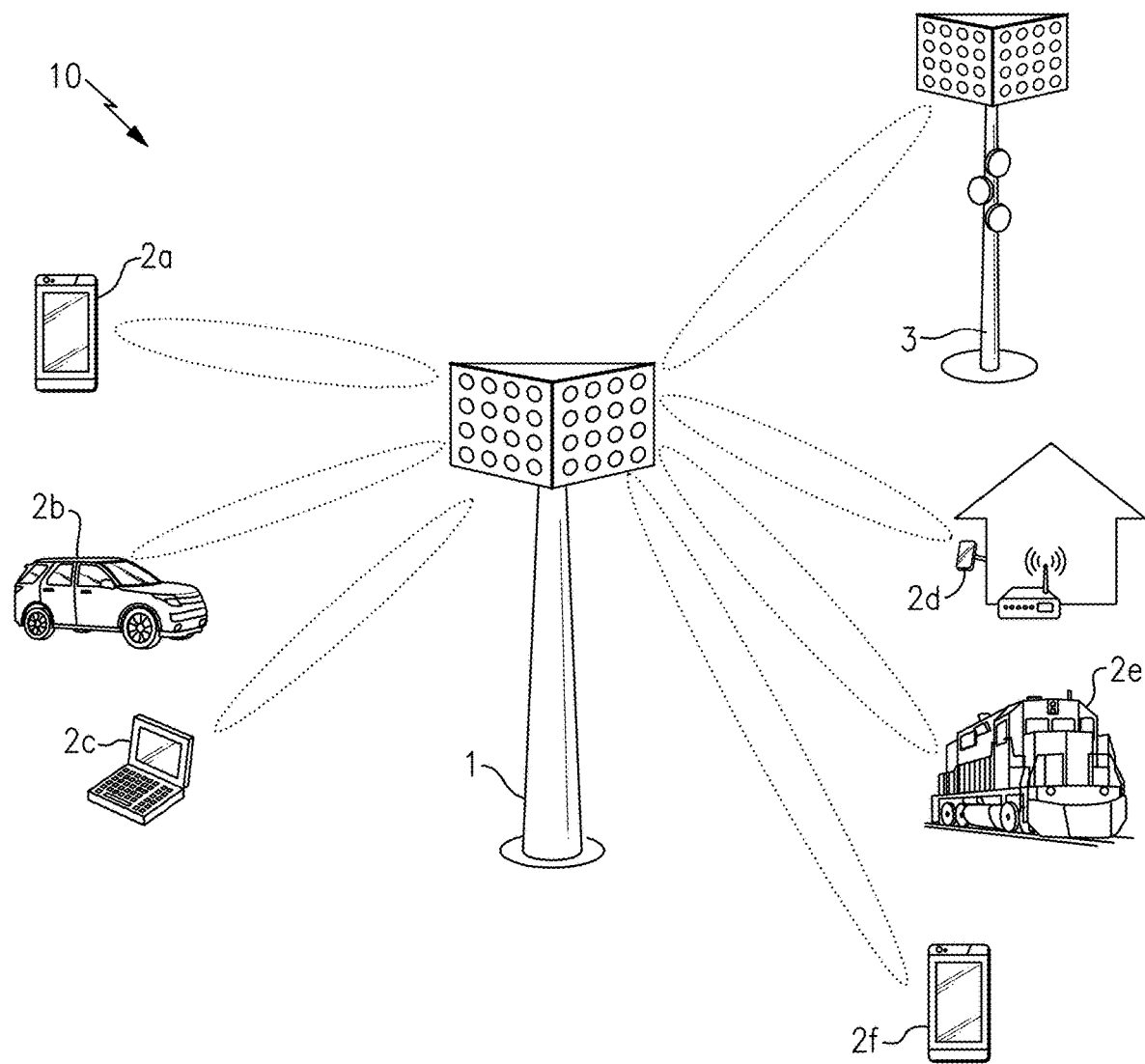
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Affiance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP plans to introduce Phase 1 of fifth generation (5G) technology in Release 15 (targeted for 2018) and Phase 2 of 5G technology in Release 16 (targeted for 2019). Release 15 is anticipated to address 5G communications at less than 6 GHz, while Release 16 is anticipated to address communications at 6 GHz and higher. Subsequent 3GPP releases will further evolve and expand 5G technology. 5G technology is also referred to herein as 5G New Radio (NR).

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices.

The illustrated communication network 10 of FIG. 1 supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6

GHz. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDM is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 ms. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Examples of RF Systems with Beam Steering Based on Harmonic Beamforming

Apparatus and methods related to beamforming of harmonics are provided herein. In certain implementations, a communication device for operating in a wireless network is provided. The communication device includes an antenna array including a plurality of antenna elements that generate a plurality of receive signals in response to a radio wave, a plurality of signal conditioning circuits operatively associated with the plurality of antenna elements and that condition the plurality of receive signals to provide beamforming of a receive beam, and a beam control circuit that controls the plurality of signal conditioning circuits to provide beam steering of the receive beam based on a direction of one or more harmonic lobes of the receive beam.

Implementing a communication device in this manner provides a number of advantages. For example, a communication device operating in a network can dynamically manage a direction of beamforming to enhance performance in the presence of receive blockers or jammers. Thus, the device can operate with higher speed, lower interference, superior blocker performance, and/or other benefits.

Communication devices that utilize millimeter wave carriers (for instance, 30 GHz to 300 GHz), centimeter wave carriers (for instance, 3 GHz to 30 GHz), and/or other carrier frequencies can employ an antenna array to provide beam formation and directivity for transmission and/or reception of signals.

For example, in the context of signal transmission, an antenna array of m×n antenna elements can be implemented in a planar module with each antenna element of the array radiating signals independently. Additionally, the signals from the antenna elements combine using constructive and destructive interference to generate an aggregate transmit signal exhibiting beam-like qualities with more signal strength propagating in a given direction away from the antenna array.

In the context of signal reception, more signal energy is received by the antenna array when the signal is arriving from a particular direction. Accordingly, an antenna array can also provide directivity for reception of signals.

The relative concentration of signal energy into a beam can be enhanced by increasing the size of the array, up to a limit. For example, with more signal energy focused into a transmitted beam, the signal is able to propagate for a longer range while providing sufficient signal level for RF communications. For instance, a signal with a large proportion of signal energy focused into the transmitted beam can exhibit high effective isotropic radiated power (EIRP).

A signal conditioning circuit can be used to condition a transmit signal for transmission via an antenna element and/or to condition a received signal from the antenna element. In one example, a signal conditioning circuit includes a phase shifter for controlling a signal phase shift, a power amplifier that amplifies a transmit signal to a power level suitable for transmission, and a low noise amplifier (LNA) that amplifies a received signal for further processing while introducing a relatively small amount of noise. The signal conditioning circuits can be controlled to steer a beam and/or to control beam strength.

The inventors herein have recognized that when signals of a fundamental frequency are beamformed to generate a fundamental beam, that harmonics are also beamformed to form harmonic beams having smaller beam width (higher directivity) relative to the fundamental beam.

In one aspect, a strength and/or direction of a signal beam generated by an array of antenna elements is dynamically managed based on one or more considerations related to harmonic lobes or beams. For example, the beam direction can be changed or steered to reduce or eliminate the impact of harmonic blockers.

The antenna arrays herein can be used to transmit and/or receive signals of a wide range of frequencies, including, but not limited to, millimeter and centimeter wave frequencies. Antenna arrays can be used in a wide variety of applications. In one example, an antenna array is included on a module of a communication device. For instance, antenna arrays can be used to transmit and/or RF signals in base stations and user equipment. Moreover, in certain implementations, separate antenna arrays are deployed for transmission and reception.

In certain embodiments, the antenna array is implemented on a laminated substrate, with an array of antenna elements formed on a first side of the laminated substrate. In one example, the array of antenna elements includes patch antenna element formed from a patterned conductive layer on the first side of the laminated substrate, with a ground plane formed using a conductive layer on a second opposing side of the laminated substrate or internal to the laminated substrate. Other examples of antenna elements include, but are not limited to, dipole antenna elements, ceramic resonators, stamped metal antennas, and/or laser direct structuring antennas.

Figure 2:
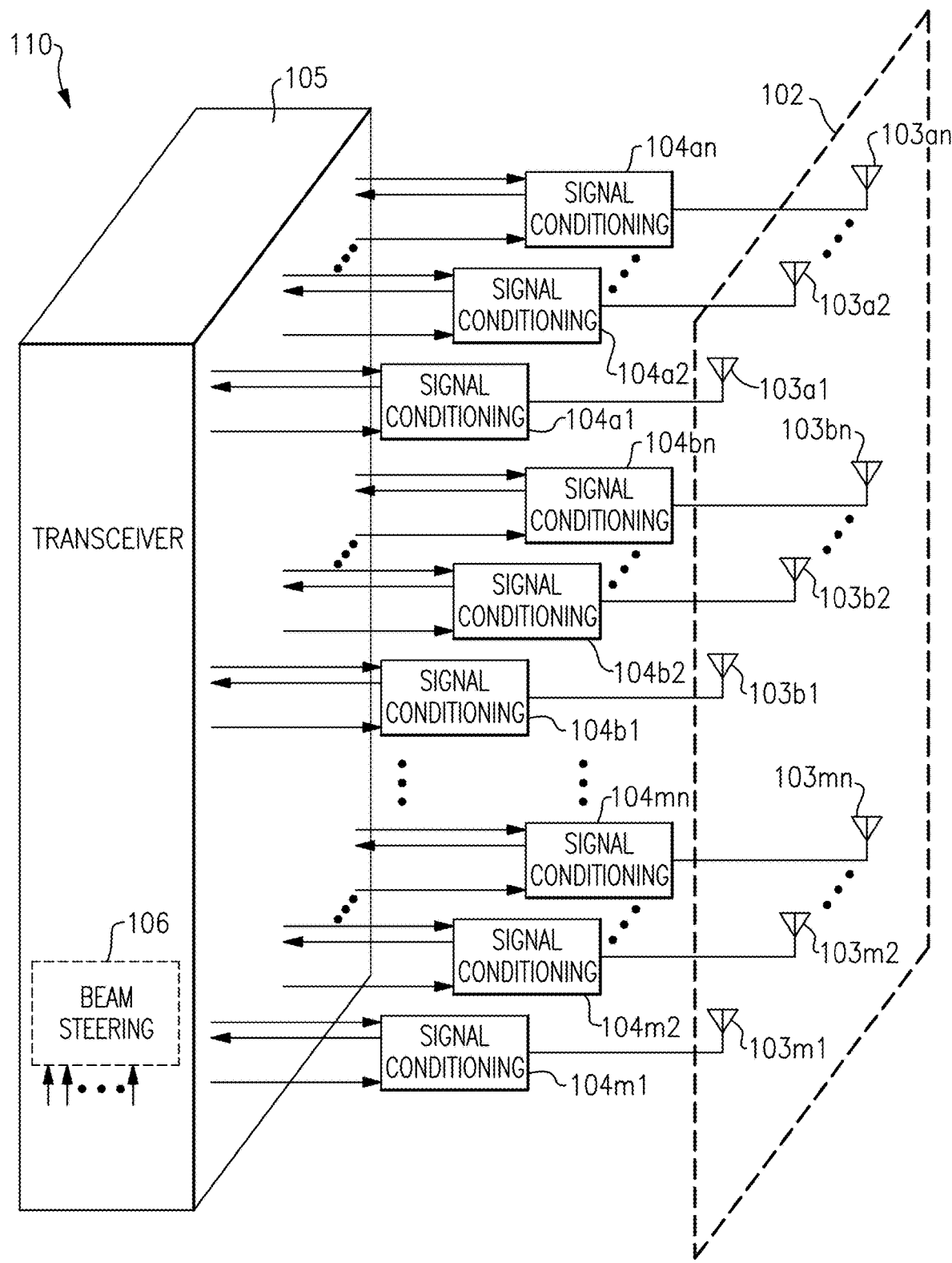
FIG. 2 is a schematic diagram of one embodiment of a radio frequency (RF) system with beam steering.

FIG. 2 is a schematic diagram of one embodiment of an RF system or communication device 110 with beam control. The RF system 110 includes an antenna array 102 including antenna elements 103a1, 103a2 . . . 103an, 103b1, 103b2 . . . 103bn, 103m1, 103m2 . . . 103mn. The RF system 110 further includes signal conditioning circuits 104a1, 104a2 . . . 104an, 104b1, 104b2 . . . 104bn, 104m1, 104m2 . . . 104mn. The RF system 110 further includes a transceiver 105 that includes a beam steering circuit 106. The beam steering circuit 106 is also referred to herein as a beam control circuit.

Although FIG. 2 illustrates the beam steering circuit 106 as being included in the transceiver 105, the beam steering circuit 106 can be in any suitable location.

The RF system 110 illustrates a specific implementation using an m×n antenna array 102 and corresponding signal conditioning circuits, where m and n are integers greater than or equal to 1 with m+n greater than 1. An RF system can more or fewer antenna elements and/or signal conditioning circuits as indicated by the ellipses. The product of m*n can vary depending on application. In one embodiment, m*n is in the range of 2 to 2048, or more particular, 16 to 256. Moreover, antenna elements can be arrayed in other patterns or configurations, including, for instance, linear arrays and/or arrays using non-uniform arrangements of antenna elements.

Each signal conditioning circuit 104a1, 104a2 . . . 104an, 104b1, 104b2 . . . 104bn, 104m1, 104m2 . . . 104mn is coupled to a corresponding one of the antenna elements 103a1, 103a2 . . . 103an, 103b1, 103b2 . . . 103bn, 103m1, 103m2 . . . 103mn. The signal conditioning circuits can be used for a wide variety of purposes, such as controlling phase shifting, transmit gain, receive gain, and/or switching.

Although an embodiment in which the signal conditioning circuits 104a1, 104a2 . . . 104an, 104b1, 104b2 . . . 104bn, 104m1, 104m2 . . . 104mn provide signal conditioning for both transmission and reception, other implementations are possible. For example, in certain implementations, a communication device includes separate arrays for receiving signals and for transmitting signals. Thus, in certain implementations, a signal conditioning circuit is used for transmit conditioning but not receive conditioning, or for receive conditioning but not transmit conditioning.

As shown in FIG. 2, the transceiver 105 includes a beam steering circuit 106 that generates a beam control signal for each of the signal conditioning circuits 104a1, 104a2 . . . 104an, 104b1, 104b2 . . . 104bn, 104m1, 104m2 . . . 104mn. Each beam control signal can be used, for example, to control a phase of a variable phase shifter, a gain of a low noise amplifier, and/or a gain of a power amplifier, thereby controlling characteristics of transmit and receive beams, such as the beam's direction and/or strength. Although the beam steering circuit 106 is included in the transceiver 105 in this example, other implementations are possible.

With respect to signal reception, the antenna elements 103a1, 103a2 . . . 103an, 103b1, 103b2 . . . 103bn, 103m1, 103m2 . . . 103mn operate to generate receive signals in response to a radio wave. Additionally, the signal conditioning circuits 104a1, 104a2 . . . 104an, 104b1, 104b2 . . . 104bn, 104m1, 104m2 . . . 104mn condition the receive signals to provide beamforming of a receive beam.

The beam steering circuit 106 dynamically manages beamforming associated with the antenna array 102 based on one or more considerations related to harmonic lobes, such as the direction, strength, and/or beam width of the harmonic lobes. In particular, the beam steering circuit 106 controls the signal conditioning circuits 104a1, 104a2 . . . 104an, 104b1, 104b2 . . . 104bn, 104m1, 104m2 . . . 104mn to provide beam steering of the receive beam based on a direction of one or more harmonic lobes of the receive beam.

Since the harmonic lobes are beamformed, controlling the characteristics of the fundamental beam also controls the characteristics of the harmonic beams. Thus, the beam control signals control not only the strength and shape of the fundamental beam, but also the harmonic beams or lobes. Thus, the beam steering circuit 106 controls beam direction and/or strength based on one or more considerations related to the harmonic lobes, such as the potential of the harmonic lobes to receive blocker signals.

The beam steering circuit 106 controls the receive beam based on a given operating environment at a given time.

Accordingly, the beam steering circuit 106 reconfigures the antenna array 102 to provide desired performance characteristics at a given moment. For example, the signal conditioning circuits 104a1, 104a2 . . . 104an, 104b1, 104b2 . . . 104bn, 104m1, 104m2 . . . 104mn can be controlled to provide an optimal or near-optimal receive beam for a given operating environment at a given time.

Thus, seamless connectivity between a pair of communication devices can be provided as the devices move relative to one another and/or an operating environment changes, and the beam steering circuit 106 can manage the beam to inhibit harmonic lobes associated with receive beamforming from interfering with performance.

In the illustrated embodiment, the beam steering circuit 106 also receives one or more inputs. The inputs can include a number of signaling factors and/or feedback signals indicative of a communication link (receive and/or transmit) and/or operating environment.

Examples of suitable inputs to the beam steering circuit 106 include data related to geo-positioning of one or more devices, a data rate achieved with another device, an observed error rate, a receive signal strength indicator (RSSI), and/or signals indicating the strength of blockers or harmonics.

Accordingly, the inputs can include signals and/or parameters received from another device in which the RF system 110 is in communication with and/or from other device(s) in the network that may be subject to interference from harmonic lobes.

Figure 3A:
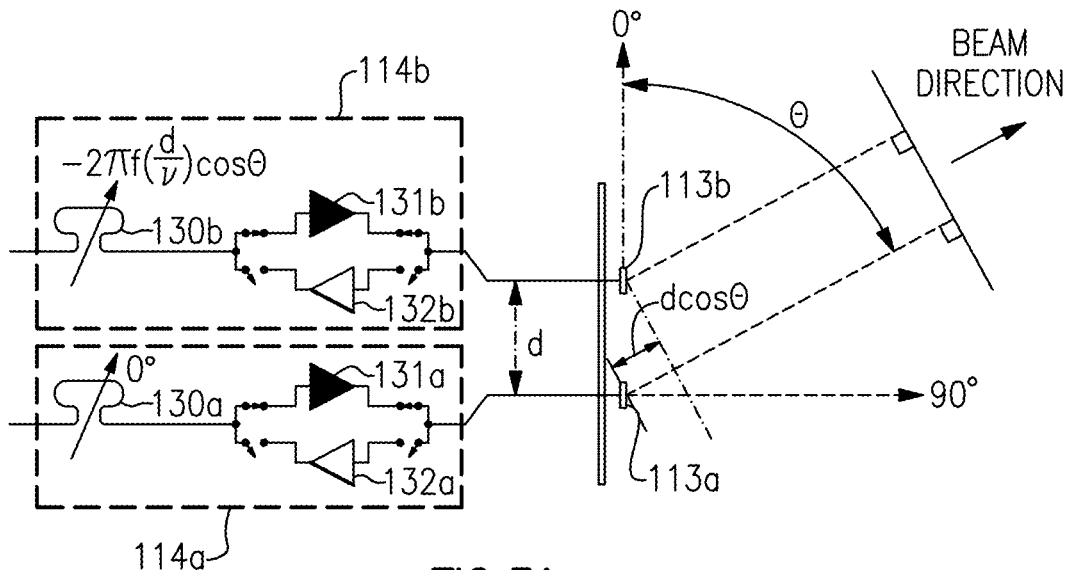
FIG. 3A is a schematic diagram of one example of beamforming to provide a transmit beam.

FIG. 3A is a schematic diagram of one example of beamforming to provide a transmit beam. FIG. 3A illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 3A illustrates one embodiment of a portion of the communication system 110 of FIG. 2.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components. Furthermore, although an implementation with an analog phase shifter is shown, the teachings herein are also applicable to implementations using digital phase shifting (for instance, phase shifting using digital baseband processing) as well as to implementations using a combination of analog phase shifting and digital phase shifting.

In the illustrated embodiment, the first antenna element 113a and the second antenna element 113b are separated by a distance d. Additionally, FIG. 3A has been annotated with an angle θ, which in this example has a value of about 90° when the transmit beam direction is substantially perpendicular to a plane of the antenna array and a value of about 0° when the transmit beam direction is substantially parallel to a plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a transceiver (for example, the transceiver 105 of FIG. 2) controls phase values of one or more phase shifters to control beamforming.

Figure 3B:
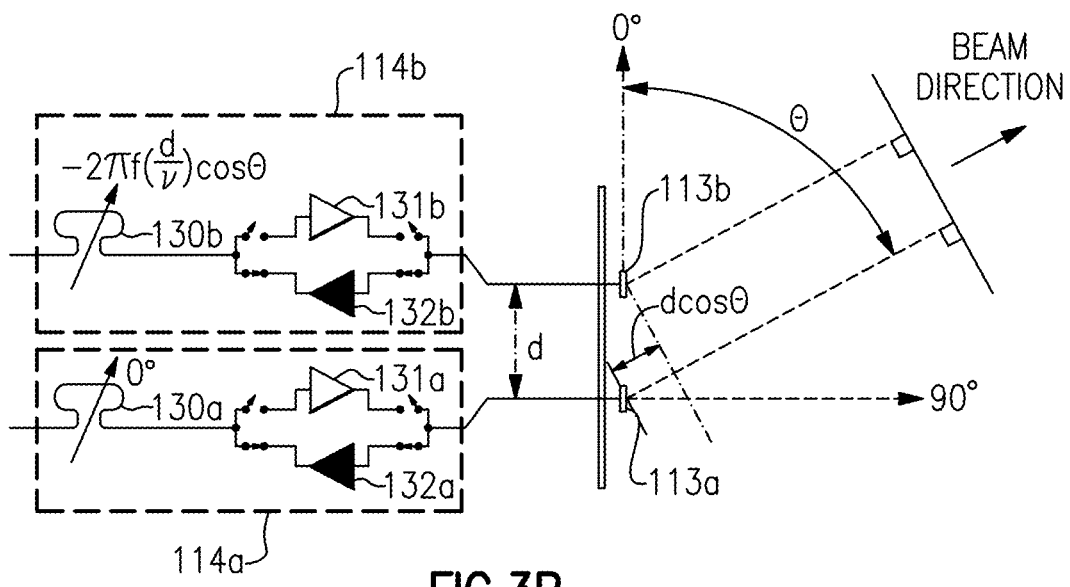
FIG. 3B is a schematic diagram of one example of beamforming to provide a receive beam.

FIG. 3B is a schematic diagram of one example of beamforming to provide a receive beam. FIG. 3B is similar to FIG. 3A, except that FIG. 3B illustrates beamforming in the context of a receive beam rather than a transmit beam.

As shown in FIG. 3B, a relative phase difference between the first phase shifter 130a and the second phase shifter 130b can be selected to about equal to $-2\pi f(d/v)\cos\theta$ radians to achieve a desired receive beam angle θ. In implementations in which the distance d corresponds to about ½λ, the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Figure 3C:
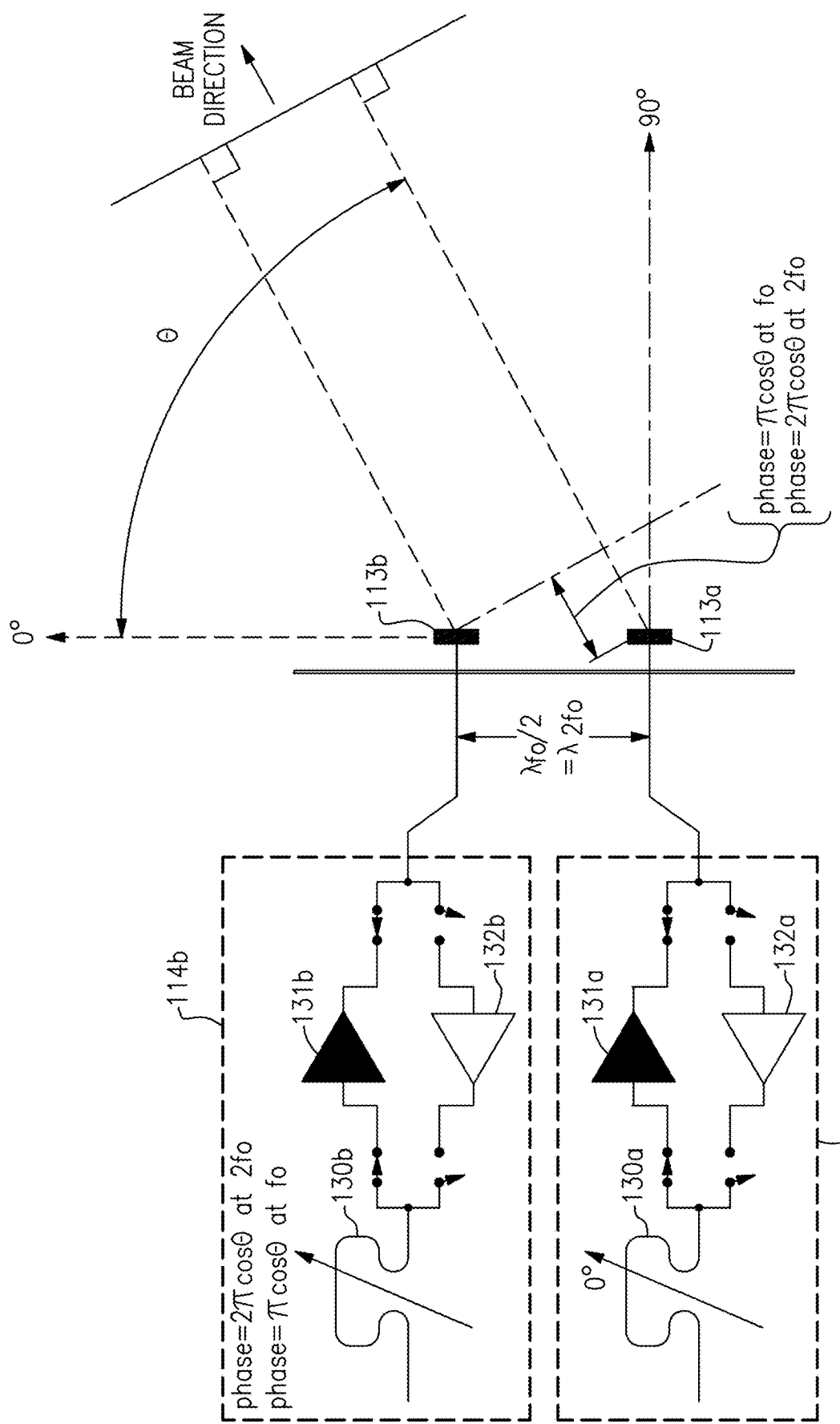
FIG. 3C is a schematic diagram of another example of beamforming to provide a transmit beam.

FIG. 3C is a schematic diagram of another example of beamforming to provide a transmit beam. FIG. 3C is similar to FIG. 3A for the case in which the distance d corresponds to about ½λ, except that FIG. 3C illustrates additional annotations related to beamforming of second harmonics. As shown in FIG. 3C, at twice the fundamental frequency or 2fo, second harmonics are beam formed when the phase difference between the between the first phase shifter 130a and the second phase shifter 130b is about equal to $2\pi\cos\theta$.

Figure 3D:
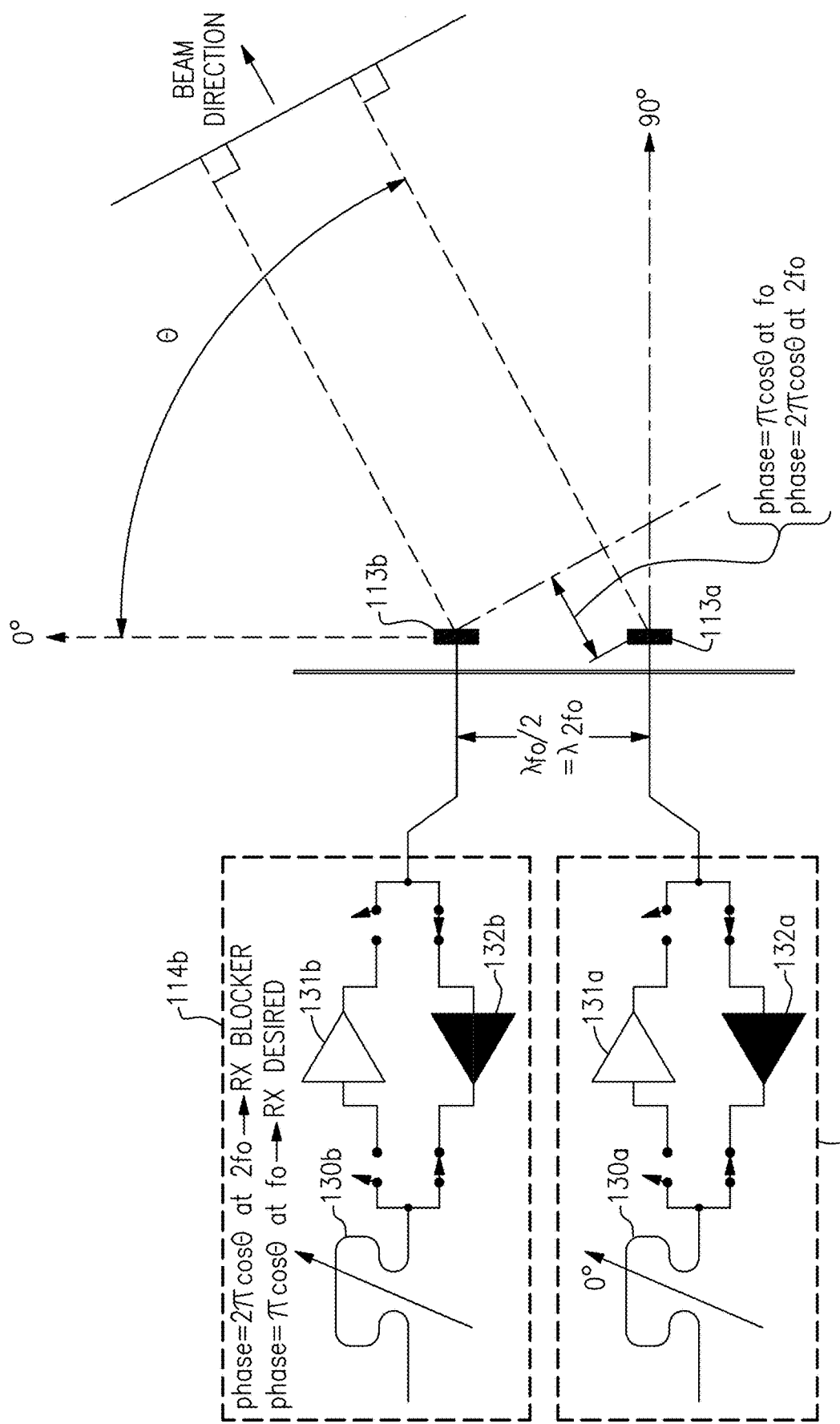
FIG. 3D is a schematic diagram of another example of beamforming to provide a receive beam.

FIG. 3D is a schematic diagram of another example of beamforming to provide a receive beam. FIG. 3D is similar to FIG. 3B for the case in which the distance d corresponds to about ½λ, except that FIG. 3D illustrates additional annotations related to beamforming of second harmonics. As shown in FIG. 3D, at twice the fundamental frequency or 2fo, second harmonics are beam formed when the phase difference between the between the first phase shifter 130a and the second phase shifter 130b is about equal to $2\pi\cos\theta$.

Accordingly, when the phase is $\pi\cos\theta$ the desired fundamental receive signal is beam formed, while when the phase is $2\pi\cos\theta$ the second harmonic is beam formed.

Figure 3E:
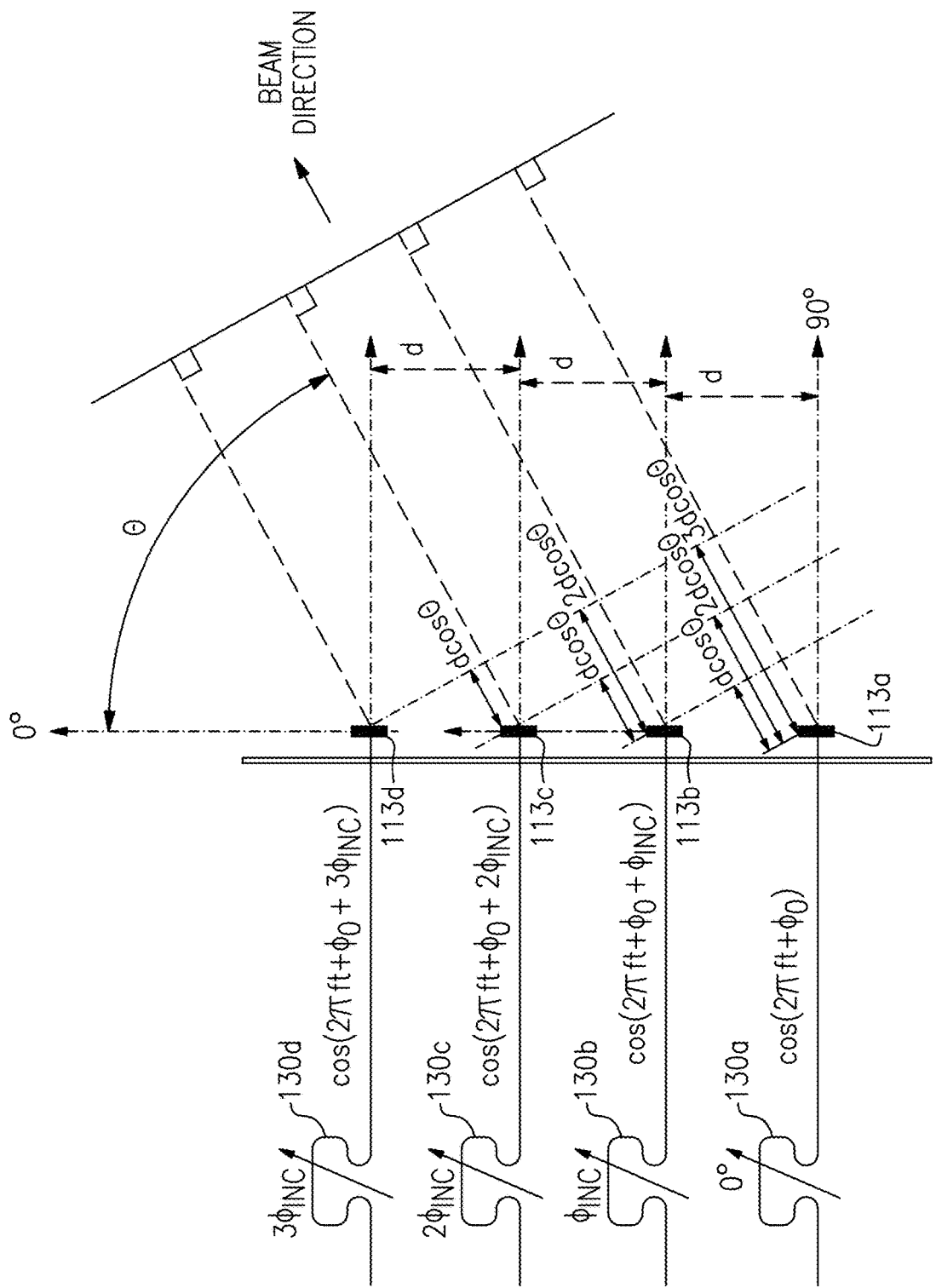
FIG. 3E is a schematic diagram of another example of beamforming.

FIG. 3E is a schematic diagram of another example of beamforming. The illustrated example shows beamforming in the context of the four antenna elements 113a-113d and four variable phase shifters 130a-130d. The example is applicable in the context of transmit beamforming and receive beamforming.

In the illustrated example, phase shifters associated with adjacent antenna elements are separated in phase by a difference of about $\phi_{INC}$ to provide fundamental beamforming. Additionally, an Nth harmonic is beam formed when the phase difference is about equal to $N*\phi_{INC}$.

With reference to FIGS. 3A-3E, in addition to the main harmonic beams discussed, additional harmonic beams can be formed, which can be, for instance, identified by simulation and/or measurements. Additionally, the examples described have been in the context of certain mathematical models, but other factors can be present that de-steer fundamental and/or harmonic beams from the indicated direction. Such factors, including, but are not limited to, phase shifts arising from transmitter and/or receiver circuits, inherent directionality of the individual antenna elements themselves, and/or operating environment. Such factors can be frequency dependent, thereby causing different amounts of de-steering of the fundamental-frequency beam relatively to harmonic beams.

Figure 4:
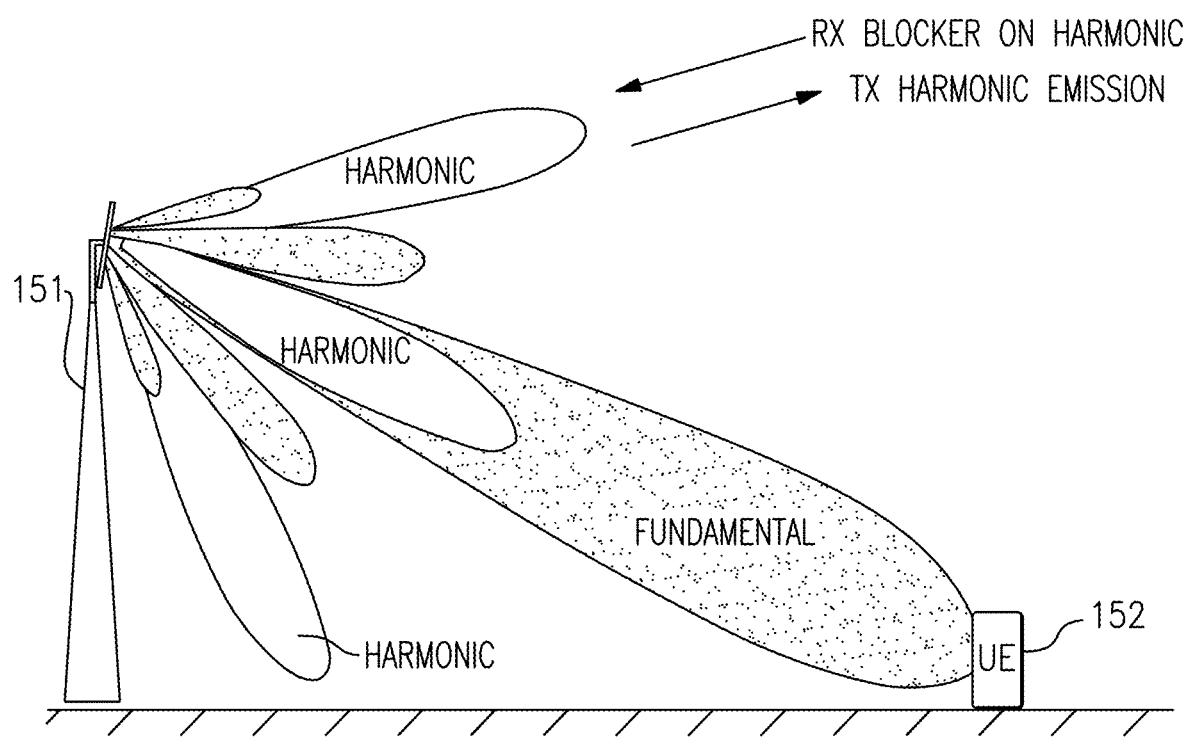
FIG. 4 is a schematic diagram of one example of beamforming between a base station and user equipment.

FIG. 4 is a schematic diagram of one example of beamforming between a base station 151 and user equipment 152.

Figure 5:
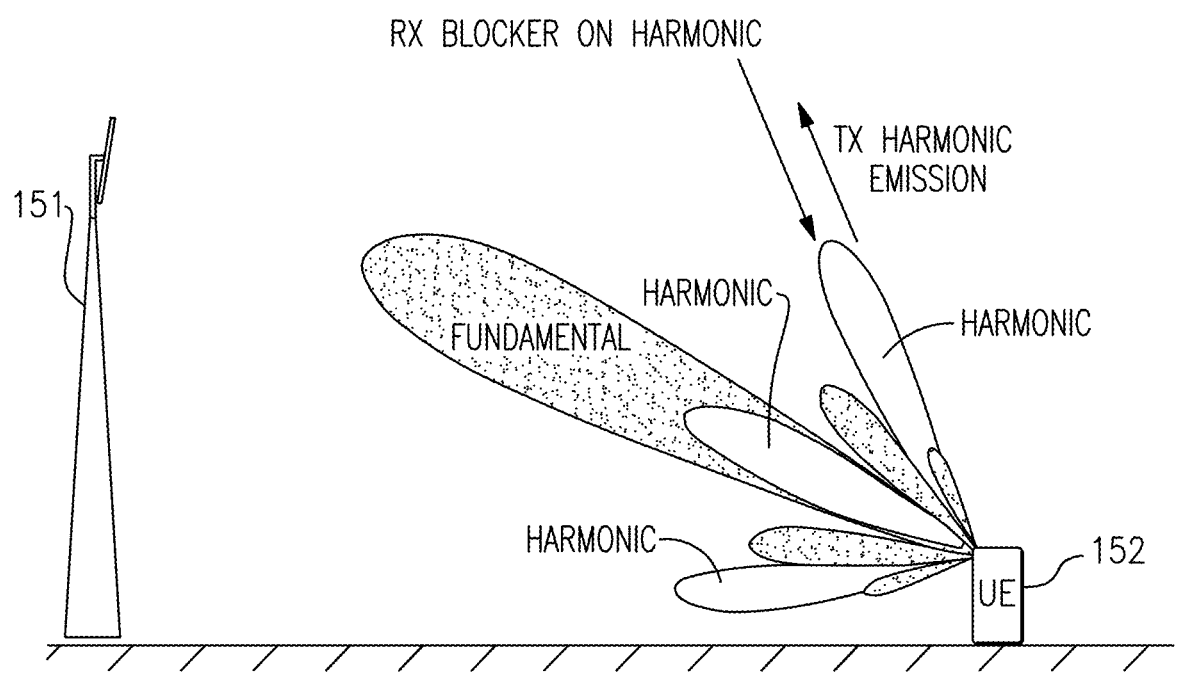
FIG. 5 is a schematic diagram of one example of fundamental beamforming between user equipment and a base station.

FIG. 5 is a schematic diagram of one example of fundamental beamforming between user equipment 152 and a base station 151.

As shown in FIGS. 4 and 5, the base station 151 and user equipment 152 can communicate using a fundamental beam that is focused toward the other device for long range communication and/or high communication rates.

The inventors herein have recognized that when signals of a fundamental frequency are beamformed to generate a fundamental beam, that harmonics are also beamformed to form harmonic beams having smaller beam width (higher directivity) relative to the fundamental beam.

In the illustrated examples, the harmonic lobes include a harmonic lobe that is substantially the same direction as the fundamental beam but of narrower beam width.

The systems and devices provided herein can provide beam steering of a receive beam based on a direction of one or more harmonic lobes of the receive beam.

Providing beam steering in this manner provides a number of advantages. For example, a communication device or base station operating in a wireless network can dynamically manage a direction of beamforming to enhance performance in the presence of receive blockers or jammers. Thus, communications can operate with higher speed, lower interference, superior blocker performance, and/or other benefits.

FIGS. 6A-16B illustrated various examples of simulations of fundamental and harmonic beamforming. In the simulations, a length of the lobe (relative to the origin of the graph) is an indication of the electric field strength of the beam. Although various results are shown, results can differ based on a variety of factors.

FIG. 6A is a two-dimensional graph of simulation results for one example of fundamental beamforming at 90° using a 2×2 antenna array.

FIG. 6B is a two-dimensional graph of simulation results for one example of second harmonic beamforming at 90° using a 2×2 antenna array.

FIG. 6C is a two-dimensional graph of simulation results for one example of third harmonic beamforming at 90° using a 2×2 antenna array.

FIG. 7A is a three-dimensional graph of simulation results for one example of fundamental beamforming at 90° using a 2×2 antenna array.

FIG. 7B is a three-dimensional of simulation results for one example of second harmonic beamforming at 90° using a 2×2 antenna array.

FIG. 7C is a three-dimensional of simulation results for one example of third harmonic beamforming at 90° using a 2×2 antenna array.

FIG. 8A is a two-dimensional graph of simulation results for one example of fundamental beamforming at 50° using a 2×2 antenna array.

FIG. 8B is a two-dimensional graph of simulation results for one example of second harmonic beamforming at 50° using a 2×2 antenna array.

FIG. 8C is a two-dimensional graph of simulation results for one example of third harmonic beamforming at 50° using a 2×2 antenna array.

FIG. 9A is a three-dimensional graph of simulation results for one example of fundamental beamforming at 50° using a 2×2 antenna array.

FIG. 9B is a three-dimensional of simulation results for one example of second harmonic beamforming at 50° using a 2×2 antenna array.

FIG. 9C is a three-dimensional of simulation results for one example of third harmonic beamforming at 50° using a 2×2 antenna array.

Figure 10C:
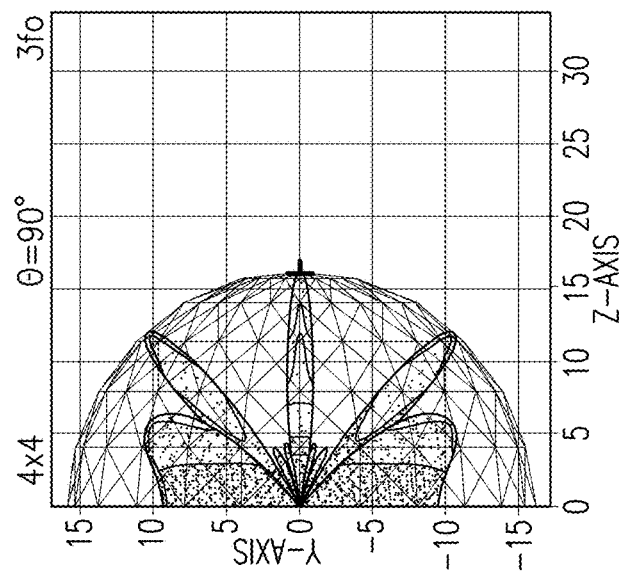
FIG. 10C is a two-dimensional graph of simulation results for one example of third harmonic beamforming at 90° using a 4×4 antenna array.
Figure 10B:
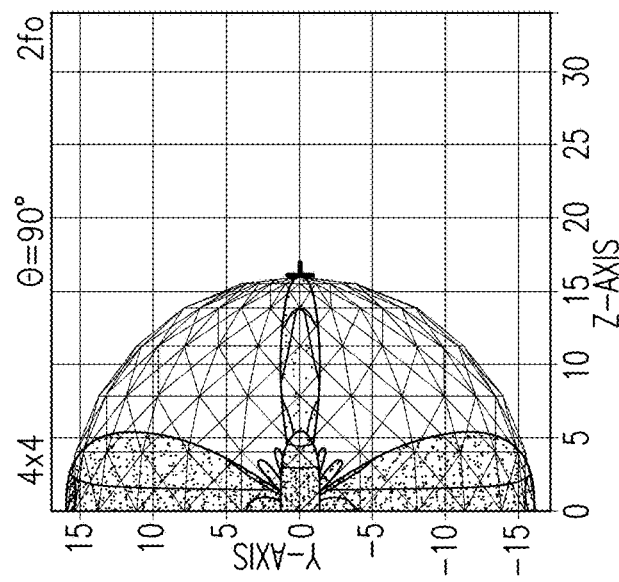
FIG. 10B is a two-dimensional graph of simulation results for one example of second harmonic beamforming at 90° using a 4×4 antenna array.
Figure 10A:
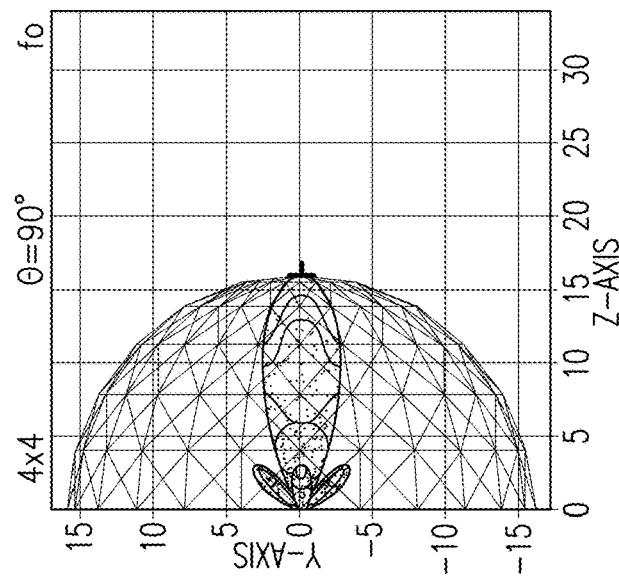
FIG. 10A is a two-dimensional graph of simulation results for one example of fundamental beamforming at 90° using a 4×4 antenna array.

FIG. 10A is a two-dimensional graph of simulation results for one example of fundamental beamforming at 90° using a 4×4 antenna array.

FIG. 10B is a two-dimensional graph of simulation results for one example of second harmonic beamforming at 90° using a 4×4 antenna array.

FIG. 10C is a two-dimensional graph of simulation results for one example of third harmonic beamforming at 90° using a 4×4 antenna array.

Figure 11B:
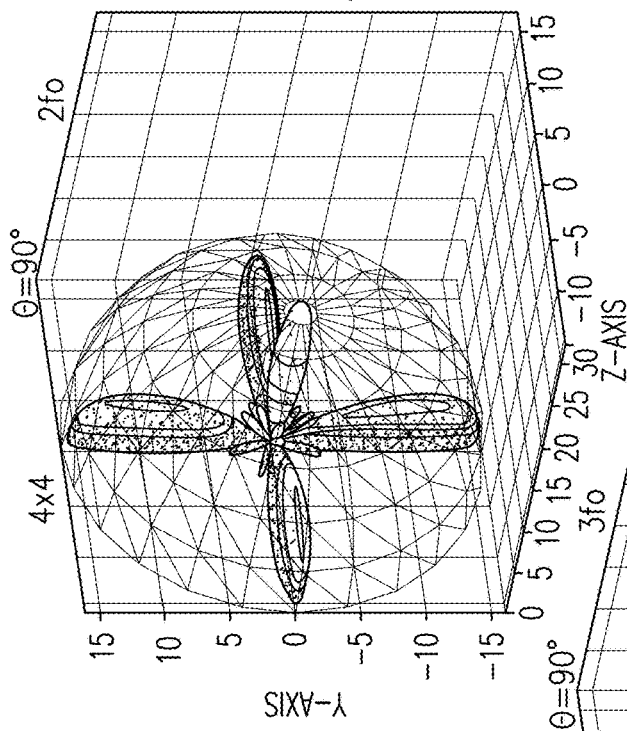
FIG. 11B is a three-dimensional of simulation results for one example of second harmonic beamforming at 90° using a 4×4 antenna array.
Figure 11C:
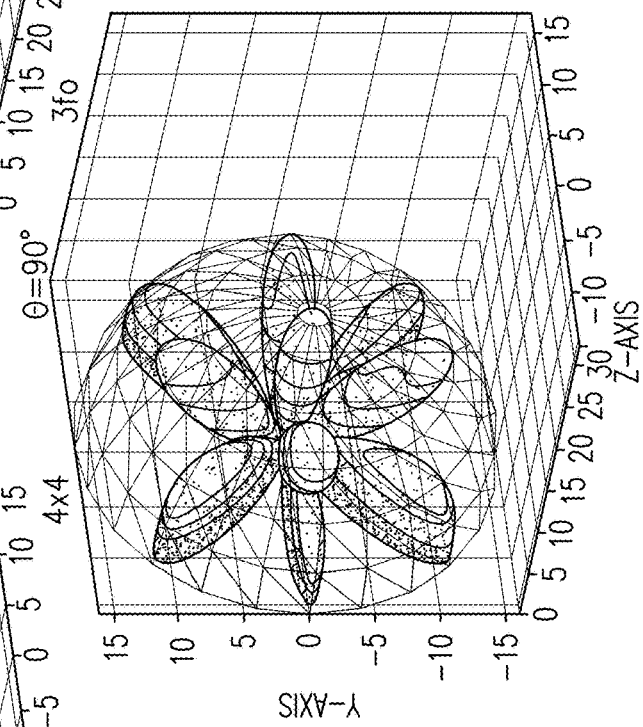
FIG. 11C is a three-dimensional of simulation results for one example of third harmonic beamforming at 90° using a 4×4 antenna array.
Figure 11A:
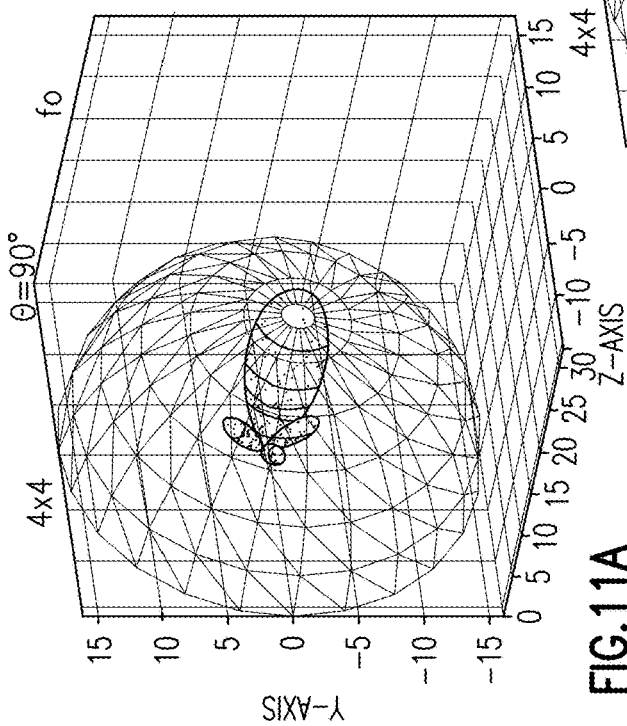
FIG. 11A is a three-dimensional graph of simulation results for one example of fundamental beamforming at 90° using a 4×4 antenna array.

FIG. 11A is a three-dimensional graph of simulation results for one example of fundamental beamforming at 90° using a 4×4 antenna array.

FIG. 11B is a three-dimensional of simulation results for one example of second harmonic beamforming at 90° using a 4×4 antenna array.

FIG. 11C is a three-dimensional of simulation results for one example of third harmonic beamforming at 90° using a 4×4 antenna array.

Figure 12A:
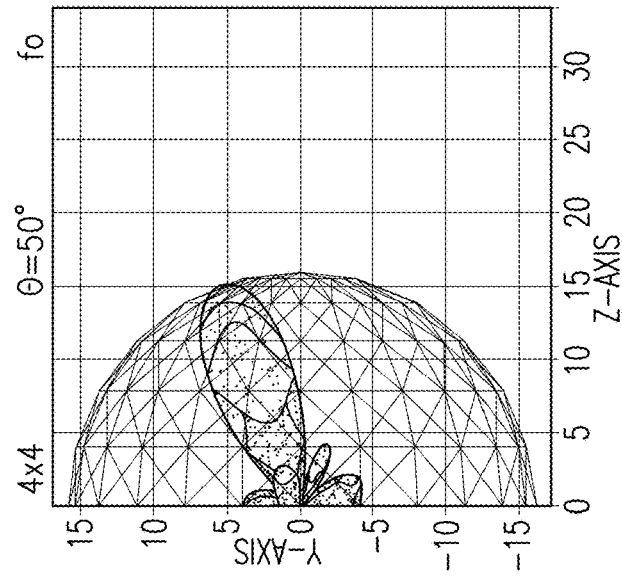
FIG. 12A is a two-dimensional graph of simulation results for one example of fundamental beamforming at 50° using a 4×4 antenna array.

FIG. 12A is a two-dimensional graph of simulation results for one example of fundamental beamforming at 50° using a 4×4 antenna array.

Figure 12B:
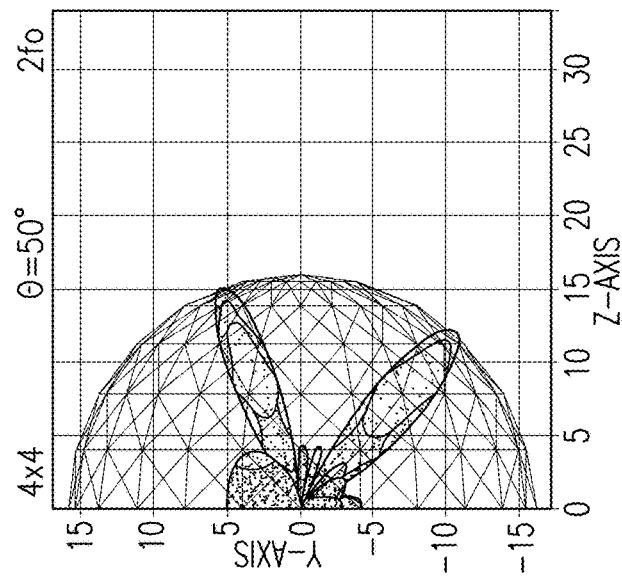
FIG. 12B is a two-dimensional graph of simulation results for one example of second harmonic beamforming at 50° using a 4×4 antenna array.

FIG. 12B is a two-dimensional graph of simulation results for one example of second harmonic beamforming at 50° using a 4×4 antenna array.

Figure 12C:
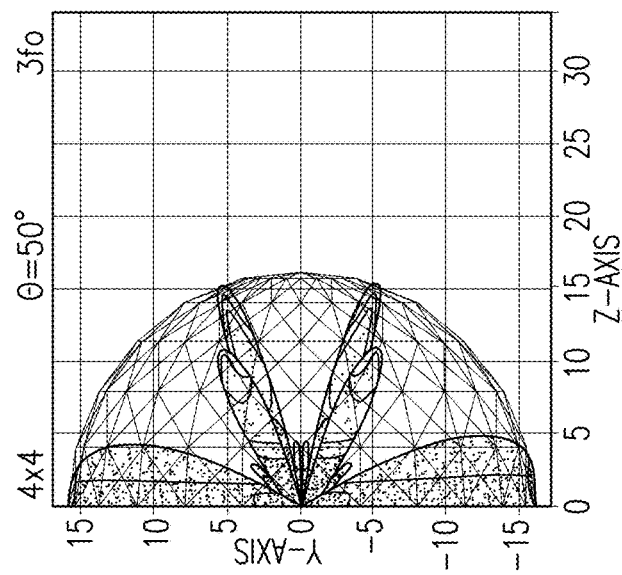
FIG. 12C is a two-dimensional graph of simulation results for one example of third harmonic beamforming at 50° using a 4×4 antenna array.

FIG. 12C is a two-dimensional graph of simulation results for one example of third harmonic beamforming at 50° using a 4×4 antenna array.

Figure 13B:
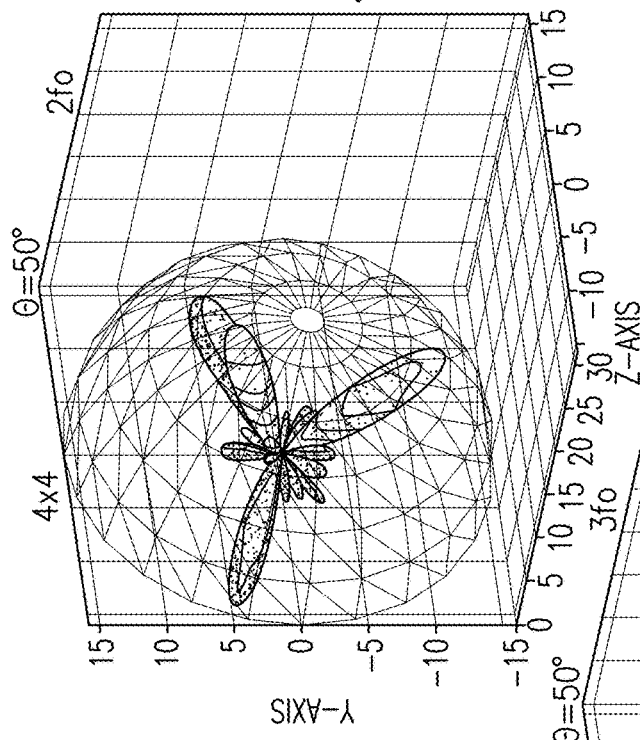
FIG. 13B is a three-dimensional of simulation results for one example of second harmonic beamforming at 50° using a 4×4 antenna array.
Figure 13C:
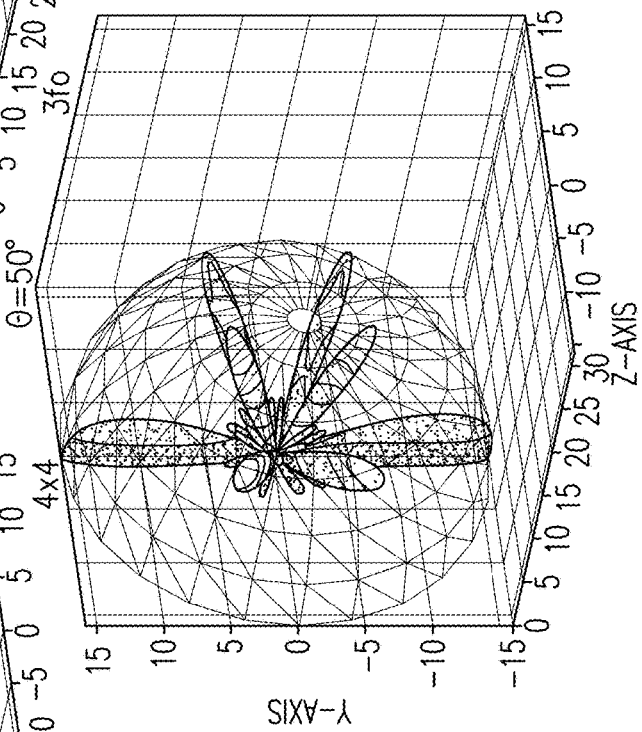
FIG. 13C is a three-dimensional of simulation results for one example of third harmonic beamforming at 50° using a 4×4 antenna array.
Figure 13A:
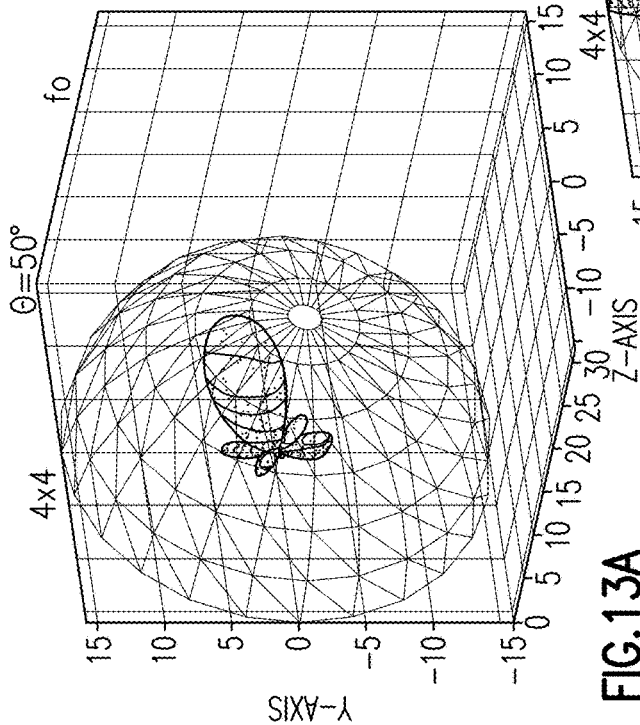
FIG. 13A is a three-dimensional graph of simulation results for one example of fundamental beamforming at 50° using a 4×4 antenna array.

FIG. 13A is a three-dimensional graph of simulation results for one example of fundamental beamforming at 50° using a 4×4 antenna array.

FIG. 13B is a three-dimensional of simulation results for one example of second harmonic beamforming at 50° using a 4×4 antenna array.

FIG. 13C is a three-dimensional of simulation results for one example of third harmonic beamforming at 50° using a 4×4 antenna array.

FIGS. 14A-16B illustrated various examples of simulations of fundamental and harmonic beamforming. The simulations show a comparison of beamforming for an 8×8 square array versus a 1×8 linear array. Although various results are shown, results can differ based on a variety of factors.

Figure 14B:
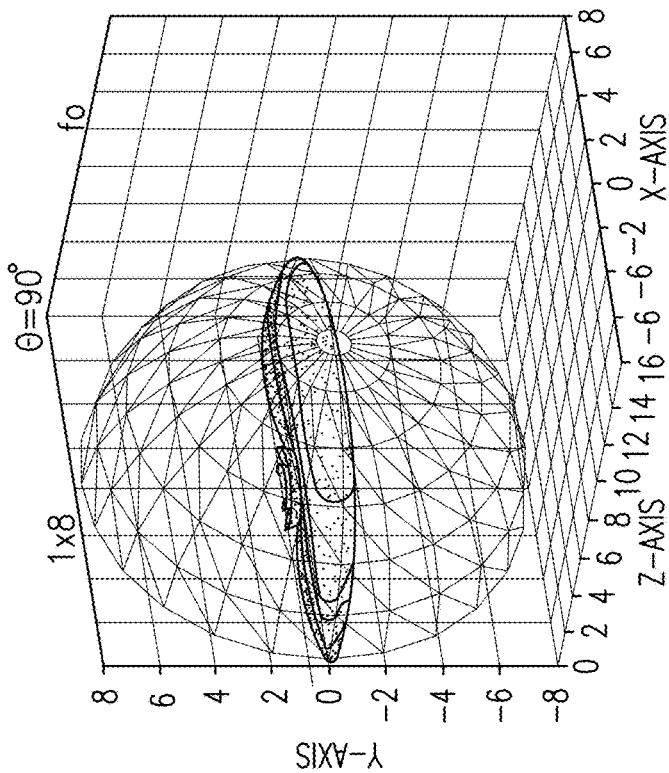
FIG. 14B is a three-dimensional graph of simulation results for one example of fundamental beamforming at 90° using a 1×8 antenna array.
Figure 14A:
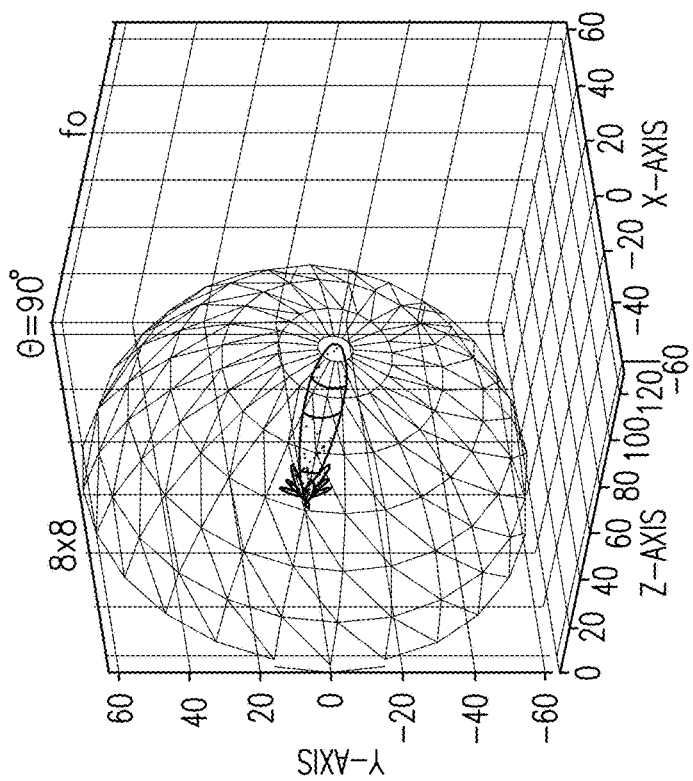
FIG. 14A is a three-dimensional graph of simulation results for one example of fundamental beamforming at 90° using an 8×8 antenna array.

FIG. 14A is a three-dimensional graph of simulation results for one example of fundamental beamforming at 90° using an 8×8 antenna array.

FIG. 14B is a three-dimensional graph of simulation results for one example of fundamental beamforming at 90° using a 1×8 antenna array.

Figure 15B:
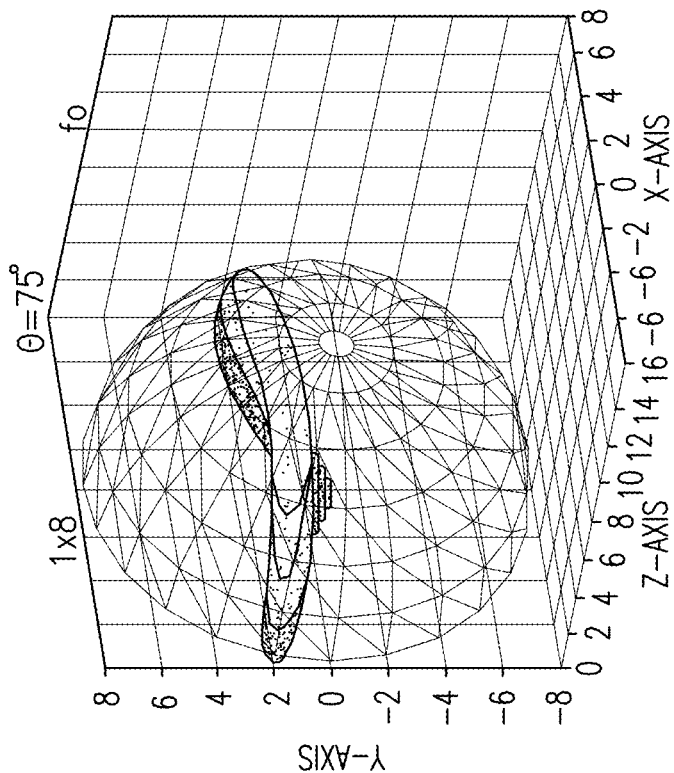
FIG. 15B is a three-dimensional graph of simulation results for one example of fundamental beamforming at 75° using a 1×8 antenna array.
Figure 15A:
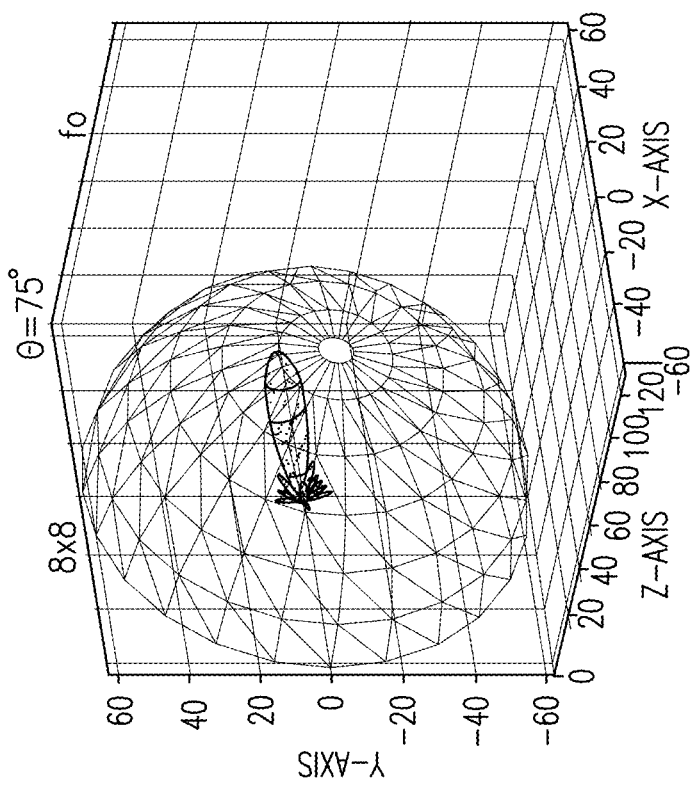
FIG. 15A is a three-dimensional graph of simulation results for one example of fundamental beamforming at 75° using an 8×8 antenna array.

FIG. 15A is a three-dimensional graph of simulation results for one example of fundamental beamforming at 75° using an 8×8 antenna array.

FIG. 15B is a three-dimensional graph of simulation results for one example of fundamental beamforming at 75° using a 1×8 antenna array.

FIG. 16A is a three-dimensional graph of simulation results for one example of second harmonic beamforming at 75° using an 8×8 antenna array.

FIG. 16B is a three-dimensional graph of simulation results for one example of second harmonic beamforming at 75° using a 1×8 antenna array.

As shown by the simulations, beamforming using a linear array can generate a disc-shaped beam pattern. Additionally, by controlling signal phasing to antenna elements of the array, the disc-shaped beam can be tilted into a cone-shaped beam. Additionally, a square array can include a superposition of beams of multiple linear arrays that are side-by-side resulting in a composite beam that is relatively narrow. As shown in FIGS. 16A and 16B, harmonics are beamformed for both linear and square arrays.

Figure 17A:
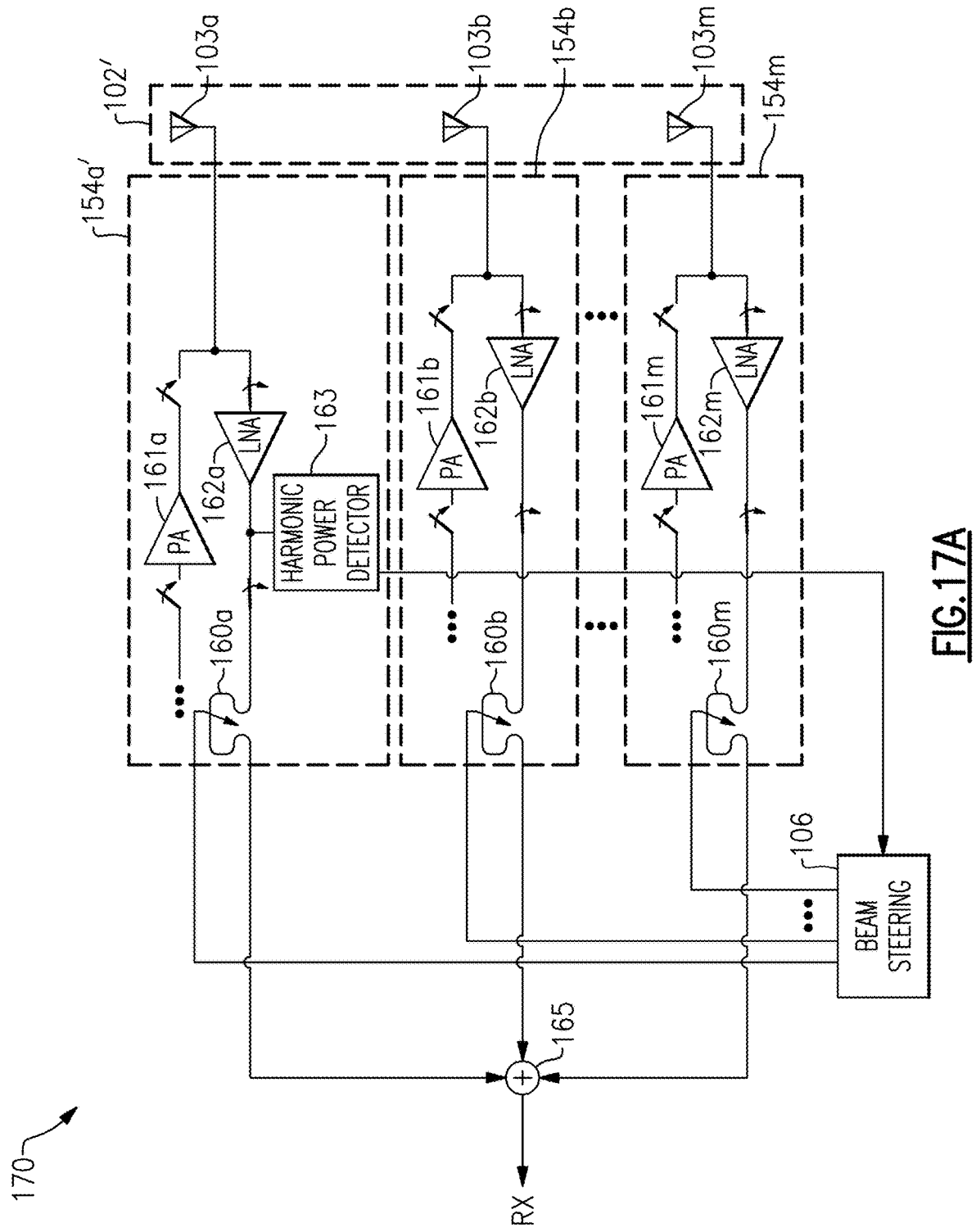
FIG. 17A is a schematic diagram of another embodiment of an RF system with beam steering.

FIG. 17A is a schematic diagram of another embodiment of an RF system 170 with beam steering. The RF system 170 includes an antenna array 102', a beam steering circuit 106, signal conditioning circuits 154a', 154b . . . 154m, and a combiner 165. Additionally, the antenna array 102' includes antenna elements 103a, 103b . . . 103m.

Although an embodiment with three antenna elements and corresponding signal conditioning circuits is shown, an RF system can more or fewer antenna elements and/or signal conditioning circuits as indicated by the ellipses. Moreover, the antenna elements can be implemented in an array.

In the embodiment shown in FIG. 17A, each of the signal conditioning circuits includes a phase shifter, a power amplifier, an LNA, and switches for controlling selection of the power amplifier and LNA. As shown in FIG. 17A, the signal conditioning circuit 154a' includes a phase shifter 160a, a power amplifier 161a, an LNA 162a, and a group of switches. Additionally, the signal conditioning circuit 154b includes a phase shifter 160b, a power amplifier 161b, an LNA 162b, and a group of switches. Furthermore, the signal conditioning circuit 154m includes a phase shifter 160m, a power amplifier 161m, an LNA 162m, and a group of switches. As shown in FIG. 17A, phase-shifted receive signals from each phase shifter is combined by the combiner 165 to generate a receive beam signal RX.

Although an example of signaling conditioning circuits with power amplifiers and LNAs is shown, other implementations of signaling conditioning circuits are possible. For example, a signaling conditioning circuit can include other arrangements of circuitry and/or additional circuitry, including, for example, switches, phase shifters, filters, amplifiers, frequency multiplexers, and/or other components.

As shown in FIG. 17A, the signal conditioning circuit 154' also includes a harmonic power detector 163, which provides a detection signal indicating a harmonic power level to the beam steering circuit 106. The detection signal can indicate the power level of one or more harmonics frequencies, such as second and/or third harmonic frequencies.

By including the harmonic power detector 163, the beam steering circuit 106 can determine a total amount of received harmonic power, which can aid the beam steering circuit 106 in determining an angle to steer the receive beam.

Although an embodiment with one harmonic power detector is illustrated, other signal conditioning circuits can additional or alternatively include a harmonic power detector. Furthermore, although FIG. 17A illustrates an embodiment in which the harmonic power detector is positioned at the output of an LNA, a harmonic power detector can be placed in other positions suitable for detecting harmonic power.

The harmonic power detector 163 can be implemented in a wide variety of ways, including, but not limited to, using peak detectors and/or average detectors.

Figure 17B:
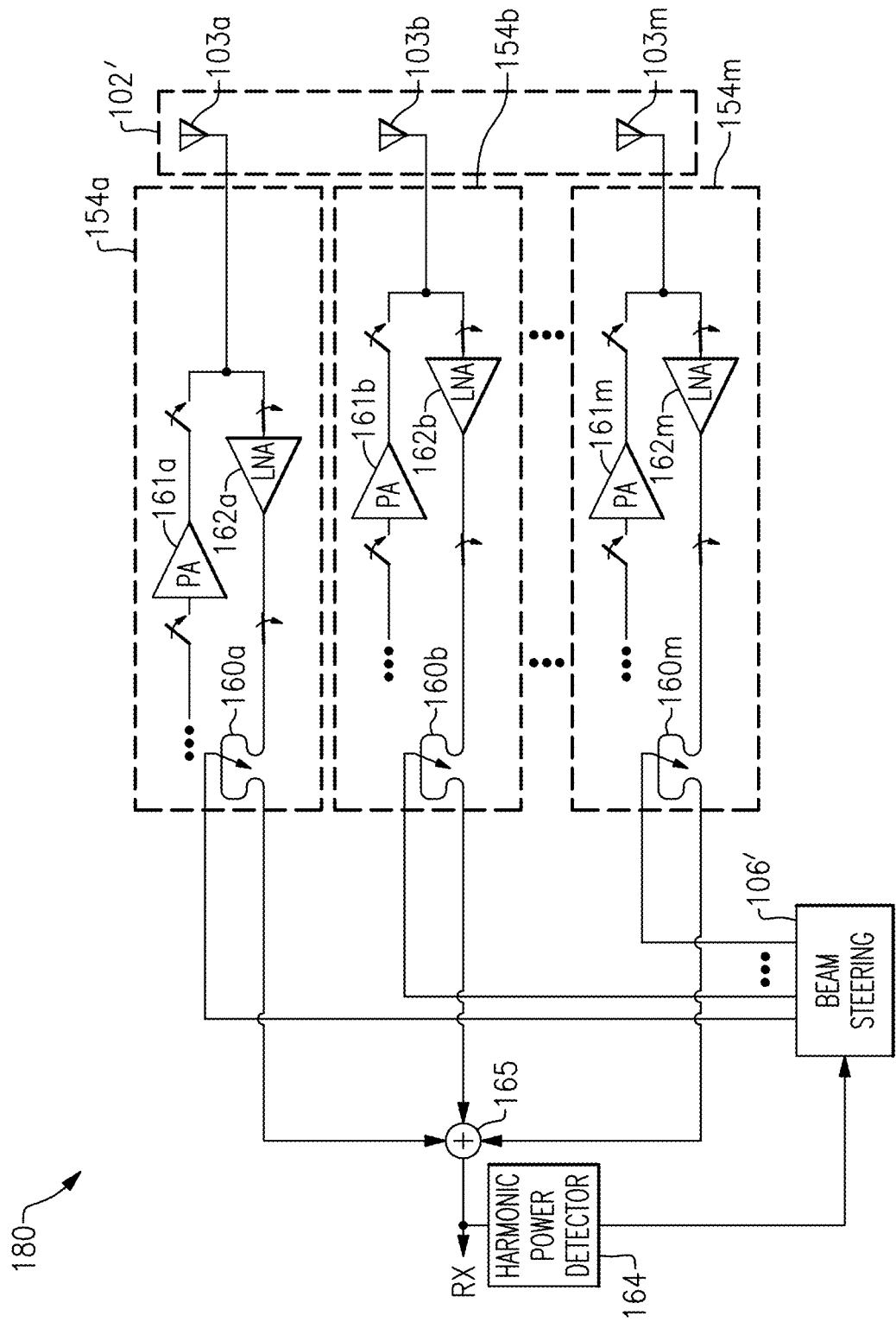
FIG. 17B is a schematic diagram of another embodiment of an RF system with beam steering.

FIG. 17B is a schematic diagram of another embodiment of an RF system 180 with beam steering. The RF system 180 includes an antenna array 102', a beam steering circuit 106', signal conditioning circuits 154a, 154b . . . 154m, a harmonic power detector 164, and a combiner 165.

The RF system 180 of FIG. 17B is similar to the RF system 170 of FIG. 17A, except that the RF system 180 includes an implementation in which the harmonic power detector 164 is positioned after the combiner 165 to thereby detect an amount of harmonic power in the receive beam RX.

By positioning the harmonic power detector 164 in this manner, the beam steering circuit 106' can steer the receive beam RX based on a detected amount of harmonic power present in the beam.

Figure 17C:
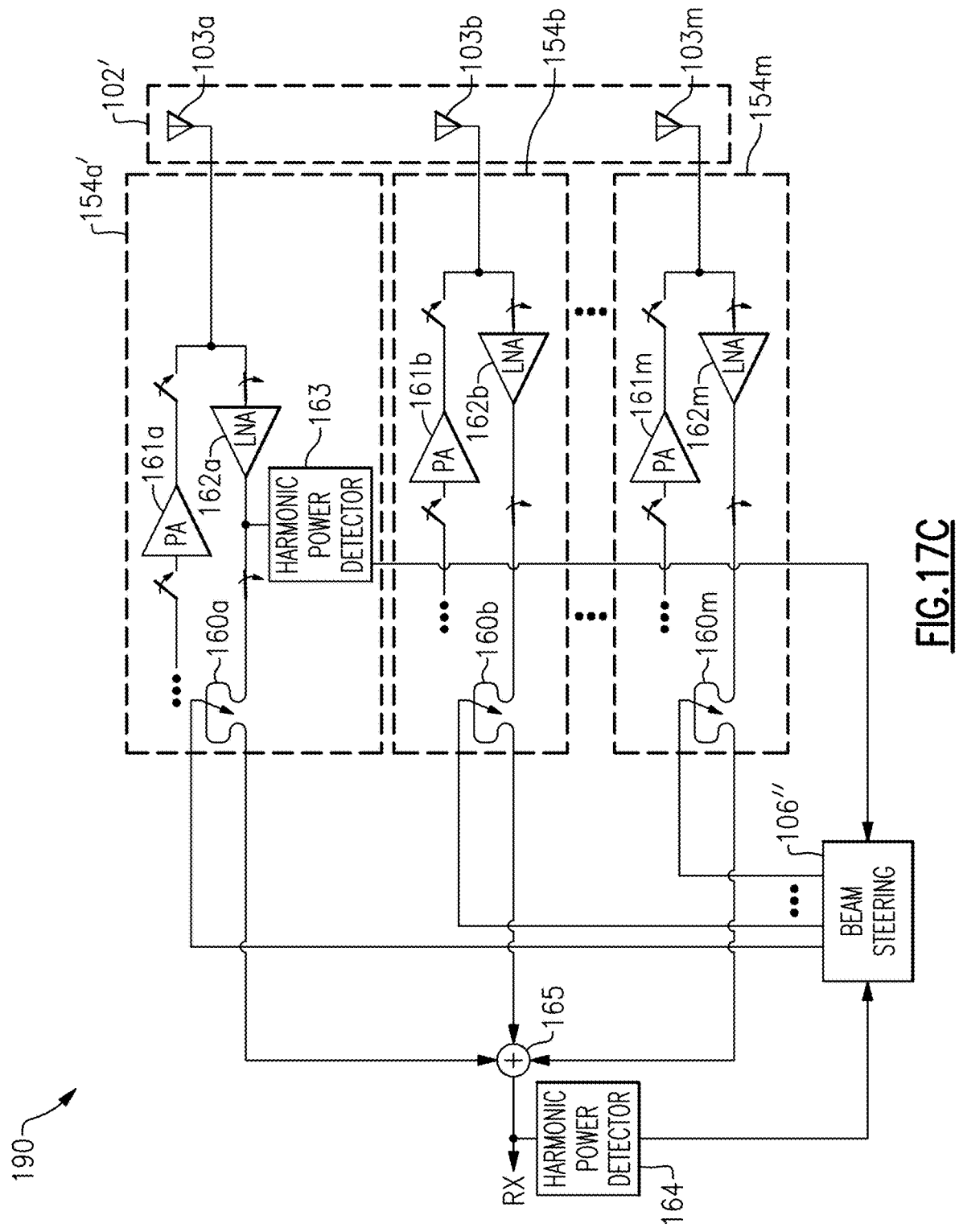
FIG. 17C is a schematic diagram of another embodiment of an RF system with beam steering.

FIG. 17C is a schematic diagram of another embodiment of an RF system 190 with beam steering. The RF system 190 includes an antenna array 102', a beam steering circuit 106", signal conditioning circuits 154a', 154b . . . 154m, a harmonic power detector 164, and a combiner 165.

The RF system 190 includes both the harmonic power detector 163 of FIG. 17A and the harmonic power detector 164 of FIG. 17B. Thus, the beam steering circuit 106" is provided with a first detection signal from the harmonic power detector 163 indicating a power of harmonic in the radio environment, and a second detection signal from the harmonic power detector 164 indicating an amount of harmonic power of the receive beam. Thus, the beam steering circuit 106" controls beam steering based both on the amount of harmonic power in the local radio environment as well as whether the RF system 190 has steered or pointed toward the source of harmonic power.

Examples of Test Equipment and Testing Methods using Testing Location Determination Based on Harmonic Beamforming When transmitting from an antenna array using beamforming, individual signals from antenna elements of the array combine using constructive and destructive interference to generate an aggregate transmit signal exhibiting beam-like qualities with more signal strength propagating in a given direction away from the antenna array. The inventors herein have recognized that when signals of a fundamental frequency are beamformed to generate a fundamental beam, that harmonics are also beamformed to form harmonic beams having smaller beam width (higher directivity) relative to the fundamental beam.

Apparatus and methods for radio frequency emissions testing based on harmonic beamforming are provided herein. In certain configurations, a method of emissions testing of cellular communication assemblies for emissions compliance is provided. The method includes transmitting a signal beam using an antenna array of a respective cellular communication assembly after manufacture thereof, the signal beam including a fundamental lobe and one or more harmonic lobes. The method further includes determining one or more testing locations of the signal beam based on detecting a direction of the fundamental lobe using test equipment, the testing locations corresponding to locations associated with the harmonic lobes. The method further includes evaluating a level of harmonic emissions at each of the one or more testing locations using the test equipment, and establishing that the respective cellular communication assembly complies with emissions testing when the level of harmonic emissions at each tested location is determined to be below a predetermined threshold.

Accordingly, harmonic testing can be performed at testing locations associated with the harmonic lobes, thereby concentrating testing to locations associated with high harmonics. To reduce testing time, harmonic testing is omitted at positions away from the harmonic lobes. Thus, when the level of harmonic emissions at the tested locations is less than the threshold, the cellular communication assembly complies with the emissions testing. However, when the level of harmonic emissions testing at one or more of the tested locations is greater than the threshold, the cellular communication is established to not be in compliance with emissions testing.

By providing emissions testing in this manner, testing locations associated with a high likelihood of harmonic emissions can be identified and rapid testing time can be achieved. Thus, quality assurance checking, platform level testing, calibration testing, certification testing, and/or conformance testing can be performed with shorter testing time. In certain embodiments, testing is performed 10 or less testing locations, for example, less than 5 testing locations.

In contrast, conventional testing methods can include numerous testing locations, for instance, at hundreds of testing points covering a full sphere around the cellular communication assembly.

A wide variety of types of cellular communication assemblies that operate with beamforming can be tested in accordance with the teachings herein. Examples of such cellular communication assemblies include, but are not limited to, packaged semiconductor components (including packaged dies), radio frequency modules (including multi-chip modules or MCMs), and/or radio frequency devices (for instance, mobile phones, tablets, laptops, and wearable electronics). Furthermore, such cellular communication assemblies can include partially manufactured components, modules, or devices.

In certain implementations, the emissions testing can be fully automated. For example, the test equipment can include an automated handler used to move a device under test (for instance, a module, mobile phone, or other suitable wireless communication assembly) into or out of a testing area (for instance, an anechoic chamber). Additionally, the device under test can generate a transmit beam, which is processed by the test equipment to determine testing locations for harmonic emissions. Thus, locations associations with harmonic beamforming can be identified and tested to determine whether or not the device under test passes the harmonic testing.

The emissions testing can correspond to a wide variety of types of emissions testing, including, but not limited to, spurious emission testing, second harmonic emissions testing, third harmonic emissions testing, radiated emissions testing, radiated immunity testing, and/or electromagnetic compatibility (EMC). Examples of such testing include, but are not limited to, testing specifications, recommendations, and/or regulations promulgated by the International Telecommunication Union (ITU), the 3rd Generation Partnership Project (3GPP), the Association of Radio Industries and Businesses (ARIB), the Telecommunications Technology Committee (TTC), the China Communications Standards Association (CCSA), the Affiance for Telecommunications Industry Solutions (ATIS), the Telecommunications Technology Association (TTA), the European Telecommunications Standards Institute (ETSI), the Telecommunications Standards Development Society, India (TSDSI), the Federal Communications Commission (FCC), the American National Standards Institute (ANSI), and/or the International Electrotechnical Commission (IEC).

Emissions testing can be performed in a wide variety of ways, including but not limited to, using automated or semi-automated test equipment operating in an anechoic chamber, a semi-anechoic chamber, a gigahertz transverse electromagnetic cell (GTEM), a reverberation chamber, an RF shield room or chamber, an open area test site (OATS), and/or in a factory or manufacturing setting, for instance, a factory floor.

The emissions testing can be performed at a wide variety of frequencies, including, for example, millimeter wave carriers (for instance, 30 GHz to 300 GHz), centimeter wave carriers (for instance, 3 GHz to 30 GHz), and/or other carrier frequencies.

Figure 18:
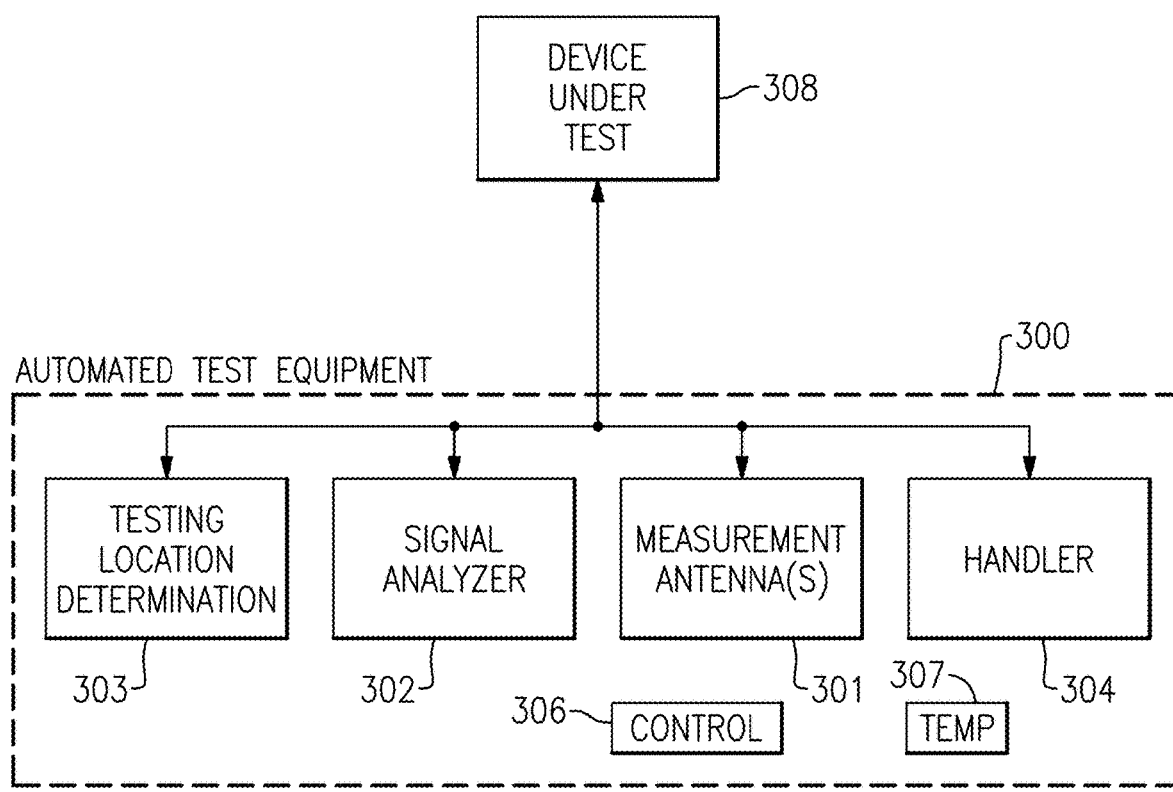
FIG. 18 is a schematic diagram of one embodiment of test equipment with testing location determination based on harmonic beamforming.

FIG. 18 is a schematic diagram of one embodiment of test equipment 300 with testing location determination based on harmonic beamforming. The test equipment 300 includes measurement antenna(s) 301, a signal analyzer 302, a testing location determination system 303, a handler 304, a controller 306, and a temperature unit or controller 307. The test equipment 300 is used to rapidly test devices under test that operate with beamforming, such as the device under test 308. The test equipment 300 is also referred to herein as an automated electronic testing system or automated test equipment (ATE).

Although FIG. 18 illustrates test equipment in accordance with one embodiment, the teachings herein are applicable to test equipment implemented in a wide variety of ways.

The test equipment 300 improves manufacturing throughput and/or provides rapid testing for emissions compliance of devices under test after manufacturing or partial manufacturing. In certain implementations, the device under test 308 corresponds to a cellular communication assembly, such as a packaged semiconductor component, radio frequency module, and/or radio frequency device.

The test equipment 300 can be used to test the wireless emissions performance of the device under test 308 (for example, a cellular communication assembly) to ensure that the device under test 308 operates within predefined performance specifications and parameters. The test equipment 300 uses automation to quickly perform measurements on devices under test (such as the device under test 308) and to evaluate the test results. The test equipment 300 can be used to speed-up testing time, to improve or identify issues with a manufacturing assembly line, and/or to reduce a number of defective devices reaching customers and/or end-users.

The measurement antenna(s) 301 operate to receive RF signals wirelessly transmitted from the device under test 308. For example, the test equipment 300 can use the measurement antenna(s) 301 to wirelessly receive a transmit beam that is beamformed and sent from the device under test 308. The transmit beam includes a fundamental lobe and one or more harmonic lobes arising from beamforming. The measurement antenna(s) 301 can include one or more antennas of a wide variety of types, including, but not limited to, wire antennas, travelling wave antennas, reflector antennas, microstrip antennas, aperture antennas, and/or any other suitable type of antenna. In certain implementations, the measurement antenna(s) 301 include one or more antenna arrays.

The signal analyzer 302 can be used to analyze RF signals received from the device under test 308 via the measurement antenna(s) 301. For example, the signal analyzer 302 can be used to process the received RF signals to detect a wide variety of RF signal characteristics, including, but not limited to, spectral content.

Figure 19:
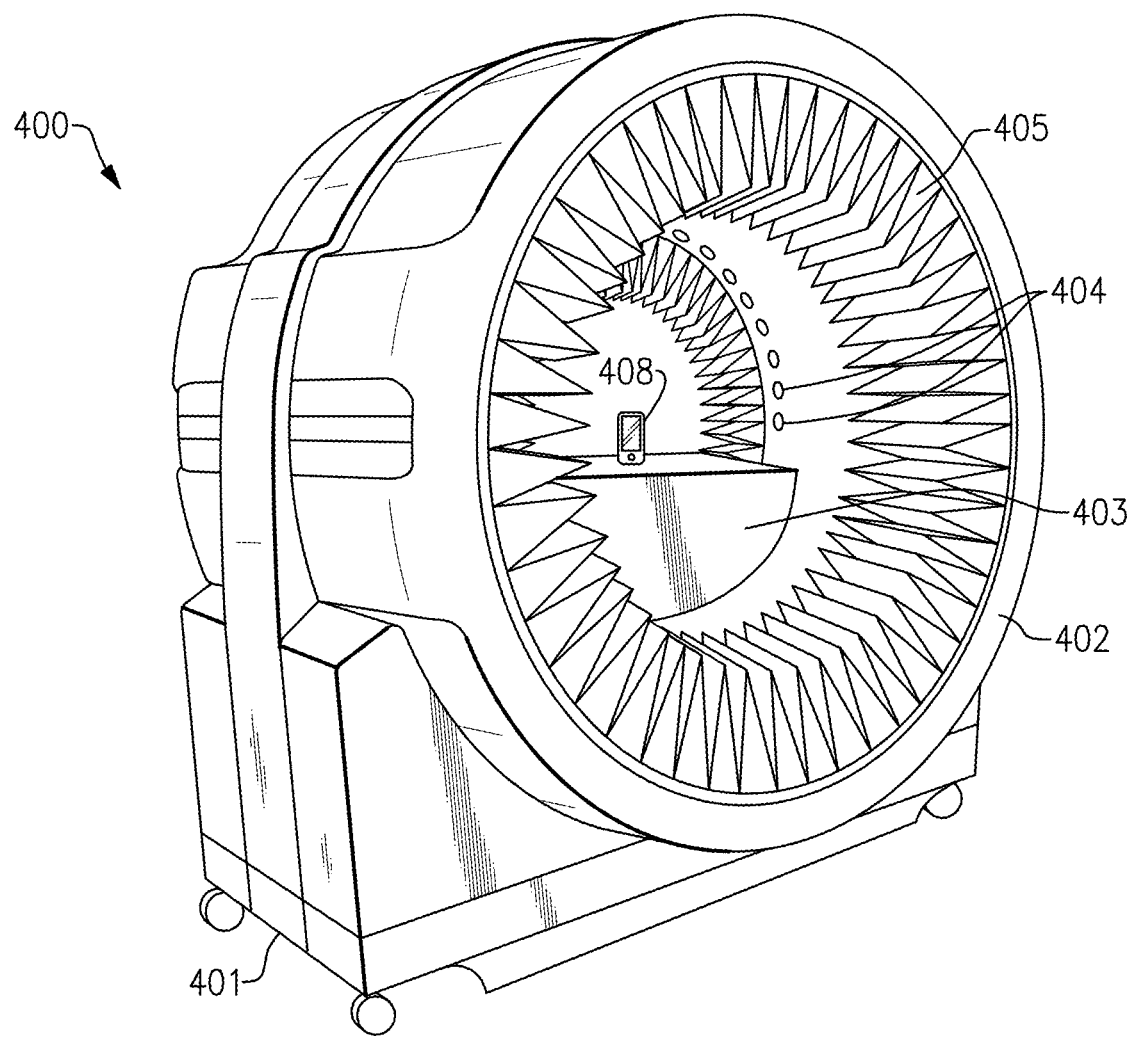
FIG. 19 is a schematic diagram of another embodiment of test equipment with testing location determination based on harmonic beamforming.

The handler 304 can be used to physically move or position the device under test 308, including, for example, moving the device under test 308 onto or off of a test platform (for example, the test platform 403 of FIG. 19).

In certain implementations, the handler 304 can include a mechanical arm to help move the device under test 308 and a plunger for holding the device under test 308 to the handler 304 using vacuum suction. However, other implementations of the handler 304 can be used, including, for example, implementations in which handler 304 secures the device under test 308 in other ways.

The handler 304 aids in positioning the device under test 308 at a desired location and/or orientation relative to components of the test equipment 300. For example, the handler 304 can be used to place the device under test 308 at a desired location relative to the measurement antenna(s) 301, thereby allowing the measurement antenna(s) to receive RF waves radiated from the device under test 308 at a particular direction and/or distance.

Although the handler 304 can be used to position the device under test 308 relative to the test equipment 300, additionally and/or alternatively the test equipment 300 can include moveable and/or rotatable parts for controlling the location of components of the test equipment 300 relative to the device under test 308. In one example, the measurement antenna(s) 301 are included in or on a moveable component.

The testing location determination system 303 is used to select testing locations for performing emissions testing. In certain implementations, the testing location determination system 303 further controls a relative location of the device under test 308 relative to the measurement antenna(s) 301, thereby coordinating placement of components for emissions testing. In certain implementations, the testing location determination system 303 includes a computer processing unit, field programmable gate array, microcontroller, and/or other suitable electronic hardware suitable for processing data and controlling operations of the test equipment 300. In certain implementations, such hardware runs in part based on executing software.

In certain embodiments, the device under test 308 and/or the measurement antenna(s) 301 are positioned to initially measure or test a fundamental lobe transmitted from the device under test 308. Additionally, the RF signal measurements from the measurement antenna(s) 301 are analyzed by the signal analyzer 302 to determine a direction and/or strength of the fundamental lobe transmitted from the device under test 308. Based on the direction and/or strength of the fundamental lobe, the testing location determination system 303 determines one or more testing locations for emissions testing. The testing locations correspond to locations associated with the harmonic lobes.

In certain implementations, the testing locations are determined by estimating a location of the harmonic lobes based on using any suitable location estimation algorithm and/or modeling. For example, as was described above with reference to FIG. 3A to 16B, the location of harmonic lobes is related to the location of the fundamental lobe. Thus, the location of harmonic lobes can be estimated based on data gathered by the measurement antenna(s) 301 and signal analyzer 302 indicating the direction and/or strength of the fundamental lobe.

Thereafter, for each of the testing locations, the device under test 308 and/or measurement antenna(s) 301 can be moved relative to one another to thereby configure the test equipment 300 to measure the emissions level at the testing location. The emissions level at each of the testing locations can be measured using the measurement antenna(s) 301 and signal analyzer 302 and/or using other suitable testing components.

When the level of harmonic emissions at the tested locations is less than a threshold, the cellular communication assembly complies with the emissions testing. However, when the level of harmonic emissions testing at one or more of the tested locations is greater than the threshold, the cellular communication is established to not be in compliance with emissions testing. In certain implementations, the threshold corresponds to a level of acceptable emissions set by a testing specification, recommendation, and/or regulation promulgated by a regulatory agency and/or standard body, such as any of those described above.

Accordingly, harmonic testing can be performed at testing locations associated with the harmonic lobes, thereby concentrating testing to locations associated with high harmonics. To reduce testing time, harmonic testing is omitted at positions away from the harmonic lobes.

By providing emissions testing in this manner, testing locations associated with a high likelihood of harmonic emissions can be identified and rapid testing time can be achieved. Thus, quality assurance checking, platform level testing, calibration testing, certification testing, and/or conformance testing can be performed with shorter testing time. In contrast, conventional testing methods can include numerous testing locations covering a full sphere around the device under test.

The temperature unit 307 can be used to control and/or monitor temperature of the test equipment 300 and/or device under test 308, thereby providing a controlled testing environment and/or allowing measurements to be tracked versus temperature. In certain implementations, the test equipment 300 performs emissions testing at two or more different temperatures.

The controller 306 can used to synchronize and/or to provide various control functionalities associated with the components of the test equipment 300, such as the measurement antenna(s) 301, the signal analyzer 302, the testing location determination system 303, the handler 304, and/or the temperature unit 307. In certain implementations, the controller 306 also controls or instructs beam transmission of the device under test 308. The controller 306 can be implemented in a wide variety of ways, including, but not limited to using a processor or other suitable electronic hardware. In certain implementations, common hardware (for instance, a computer processing unit, a field programmable gate array, a microcontroller, and/or other suitable electronic hardware) is used to implement the controller 306 and other functionality of the test equipment 300, such as the testing location determination system 303.

Although the test equipment 300 has been illustrated and described as including certain components for clarity, the test equipment 300 can be modified or adapted in other ways. For example, the test equipment 300 can further include additional components, such as power supplies, sensors, digital signal processing instruments, and/or cables and interconnect.

FIG. 19 is a schematic diagram of another embodiment of test equipment 400 with testing location determination based on harmonic beamforming. The test equipment 400 includes a housing 401, a rotatable chamber 402, a rotatable testing platform 403, and measurement antennas 404. In the illustrated embedment, a device under test 408 (a mobile device, in this example) has been positioned in the rotatable chamber 402. As shown in FIG. 19, the rotatable chamber 402 includes inner walls 405 operable to inhibit signal reflection to thereby provide anechoic characteristics to the rotatable chamber 402.

In the illustrated embodiment, the platform 402 is rotatable about an axis extending in a vertical direction with respect to FIG. 19. Additionally, the rotatable chamber 402 is implemented with a cylinder shape, and is rotatable about an axis of the cylinder. Additionally, the housing 401 includes electronics (for instance, a testing location determination system and/or controller) therein configured to control the rotation of the platform 403 and the rotatable chamber 402, thereby controlling relative positioning between the device under test 408 and the measurement antennas 404.

The test equipment 400 of FIG. 19 illustrates one embodiment of test equipment suitable for operating with testing location determination based on harmonic beamforming. For example, the test equipment 400 can be implemented with a testing location determination system (for instance, the testing location determination system 303 of FIG. 18) to thereby perform emissions testing at testing locations associated with harmonic lobes. Although the test equipment 400 illustrates one embodiment of test equipment with testing location determination based on harmonic beamforming, the teachings herein are applicable to test equipment implemented in a wide variety of ways.

By providing emissions testing in this manner, testing locations associated with a high likelihood of harmonic emissions can be identified and rapid testing time can be achieved. Thus, quality assurance checking, platform level testing, calibration testing, certification testing, and/or conformance testing can be performed with shorter testing time.

Figure 20:
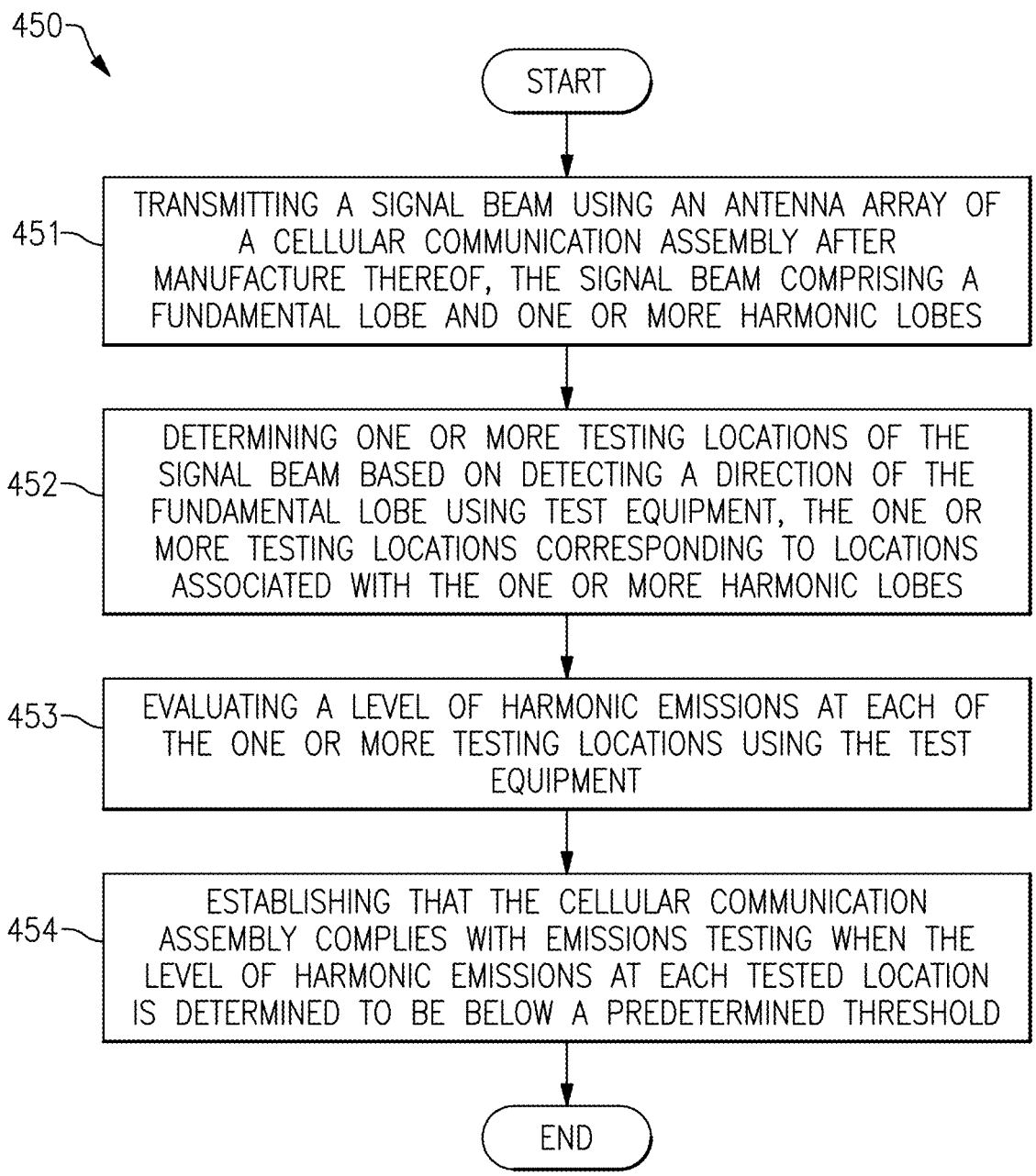
FIG. 20 is a schematic diagram of a method of emissions testing according to one embodiment.

FIG. 20 is a schematic diagram of a method 450 of emissions testing according to one embodiment. It will be understood that the method 450 may include greater or fewer operations and the operations may be performed in any order, as necessary. The illustrated method 450 can be used to test a wide variety of devices under test, including, but not limited to, cellular communication assemblies. The method 450 can be performed by any suitable test equipment, such as automated or semi-automated test equipment. In one embodiment, the method 450 is performed by the test equipment 300 of FIG. 18. In another embodiment, the method 450 is performed by the test equipment 400 of FIG. 19.

Although the method 450 illustrates one embodiment of a method of emissions testing, the teachings herein are applicable to testing methods implemented in a wide variety of ways.

The method 450 starts at block 451, in which a signal beam is transmitted using an antenna array of a cellular communication assembly after manufacture thereof (including full or partial manufacture), the signal beam including a fundamental lobe and one or more harmonic lobes.

Although illustrated as beginning at step 451, the method 450 can include additional steps prior to step 451. For example, in certain implementations, an automated handler (for example, the handler 304 of FIG. 18) is used to move (for instance, into a testing chamber and/or onto a testing platform) the cellular communication assembly prior to transmitting the signal beam.

In an ensuing block 452, one or more testing locations of the signal beam are determined based on detecting a direction of the fundamental lobe using test equipment, the one or more testing locations corresponding to locations associated with the one or more harmonic lobes. In certain configurations, detecting the direction of the fundamental lobe includes receiving the signal beam using one or more measurement antennas (for example, the measurement antenna(s) 301 of FIG. 18), analyzing the received signal(s) using a signal analyzer (for example, the signal analyzer 302 of FIG. 18), and determining the one or more testing locations using a testing location determination system (for example, the testing location determination system 303 of FIG. 18).

The method 450 continues at a block 453, in which a level of harmonic emissions is evaluated at each of the testing locations using the test equipment. In certain implementations, the harmonic emissions are measured at each of the testing locations by controlling the relative positioning between the cellular communication assembly (for example, the device under test 308 of FIG. 18) and one or more measurement antennas (for example, the measurement antenna(s) 301 of FIG. 18) to arrive at the testing location, and measuring the emissions level at the testing location using any suitable testing equipment (for example, the measurement antenna(s) 301 and the signal analyzer 302 of FIG. 18).

In an ensuing block 454, the cellular communication assembly is established to comply with the emissions testing when the level of harmonic emissions at each tested location is determined to be below a predetermined threshold.

Thus, when the level of harmonic emissions at the tested locations is less than the threshold, the cellular communication assembly complies with the emissions testing. However, when the level of harmonic emissions testing at one or more of the tested locations is greater than the threshold, the cellular communication is established to not be in compliance with emissions testing.

Although the method 450 is illustrated as ending at block 454, the method 450 can be iteratively repeated to test multiple cellular communication assemblies. For example, the method can be restarted at block 451 for the next cellular communication assembly.

Examples of RF Systems, Modules, and Devices

Figure 21:
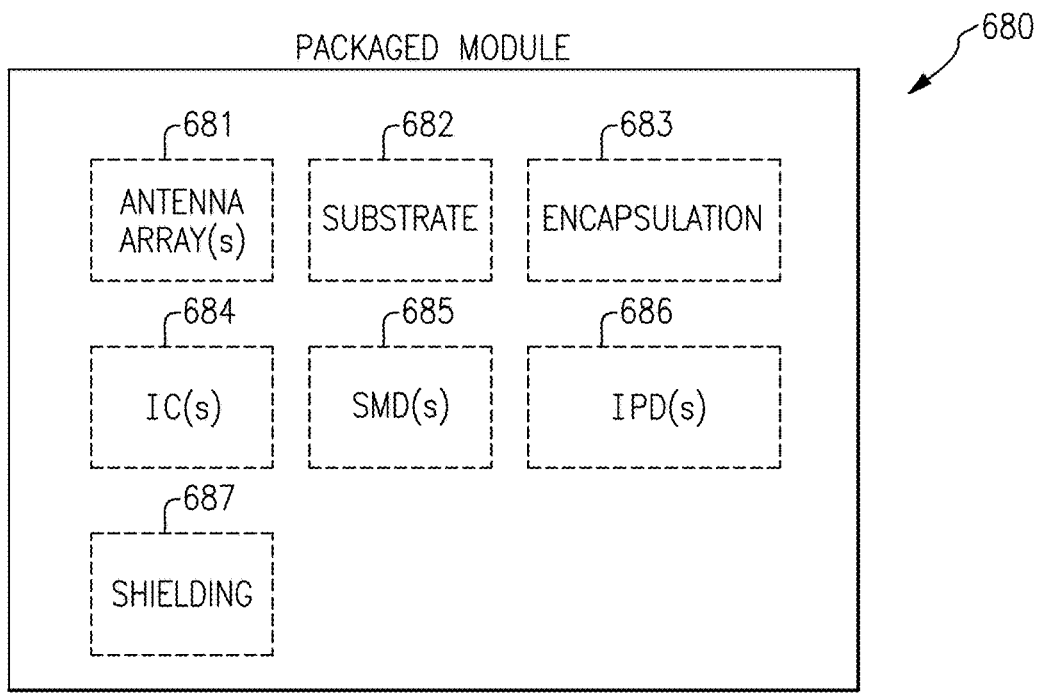
FIG. 21 is a plan view of one embodiment of a module.

FIG. 21 is a plan view of one embodiment of a module 680. The module 680 includes antenna array(s) 681, a substrate 682, encapsulation 683, IC(s) 684, surface mound device(s) or SMD(s) 685, integrated passive device(s) or IPD(s) 686, and shielding 687. The module 680 illustrates various examples of components and structures that can be included in a module of a communication device that provides beam control.

Although one example of a combination of components and structures is shown, a module can include more or fewer components and/or structures.

Figure 22A:
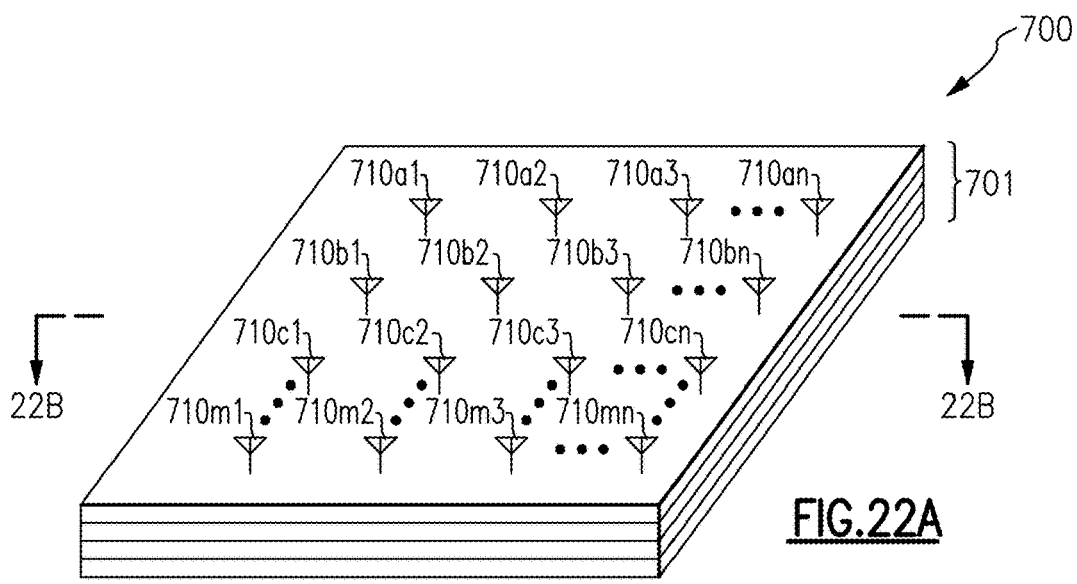
FIG. 22A is a perspective view of another embodiment of a module.
Figure 22B:
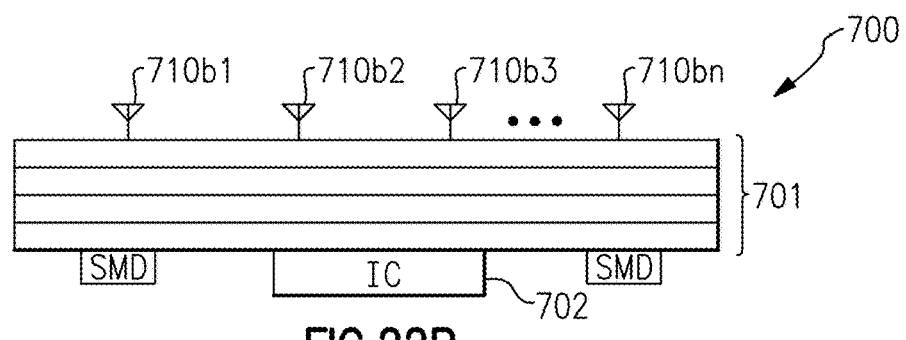
FIG. 22B is a cross-section of the module of FIG. 22A taken along the lines 22B-22B.

FIG. 22A is a perspective view of another embodiment of a module 700. FIG. 22B is a cross-section of the module 700 of FIG. 22A taken along the lines 22B-22B.

The module 700 includes a laminated substrate or laminate 701, a semiconductor die or IC 702 (not visible in FIG. 22A), SMDs (not visible in FIG. 22A), and an antenna array including antenna elements 710a1, 710a2, 710a3 . . . 710an, 710b1, 710b2, 710b3 . . . 710bn, 710c1, 710c2, 710c3 . . . 710cn, 710m1, 710m2, 710m3 . . . 710mn.

Although not shown in FIGS. 22A and 22B, the module 700 can include additional structures and components that have been omitted from the figures for clarity. Moreover, the module 700 can be modified or adapted in a wide variety of ways as desired for a particular application and/or implementation.

The antenna elements antenna elements 710a1, 710a2, 710a3 . . . 710an, 710b1, 710b2, 710b3 . . . 710bn, 710c1, 710c2, 710c3 . . . 710cn, 710m1, 710m2, 710m3 . . . 710mn are formed on a first surface of the laminate 701, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive.

In the illustrated embodiment, the IC 702 is on a second surface of the laminate 701 opposite the first surface. However, other implementations are possible. In one example, the IC 702 is integrated internally to the laminate 701.

In certain implementations, the IC 702 includes signal conditioning circuits associated with the antenna elements 710a1, 710a2, 710a3 . . . 710an, 710b1, 710b2, 710b3 . . . 710bn, 710c1, 710c2, 710c3 . . . 710cn, 710m1, 710m2, 710m3 . . . 710mn and a beam steering circuit for dynamically controlling the signal conditioning circuits based on one or more considerations related to harmonic lobes. Although an implementation with one semiconductor chip is shown, the teachings herein are applicable to implementations with additional chips.

The laminate 701 can include various structures including, for example, conductive layers, dielectric layers, and/or solder masks. The number of layers, layer thicknesses, and materials used to form the layers can be selected based on a wide variety of factors, and can vary with application and/or implementation. The laminate 701 can include vias for providing electrical connections to signal feeds and/or ground feeds of the antenna elements. For example, in certain implementations, vias can aid in providing electrical connections between signaling conditioning circuits of the IC 702 and corresponding antenna elements.

The antenna elements 710a1, 710a2, 710a3 ... 710an, 710b1, 710b2, 710b3 ... 710bn, 710c1, 710c2, 710c3 ... 710cn, 710m1, 710m2, 710m3 ... 710mn can correspond to antenna elements implemented in a wide variety of ways. In one example, the array of antenna elements includes patch antenna element formed from a patterned conductive layer on the first side of the laminate 701, with a ground plane formed using a conductive layer on opposing side of the laminate 701 or internal to the laminate 701. Other examples of antenna elements include, but are not limited to, dipole antenna elements, ceramic resonators, stamped metal antennas, and/or laser direct structuring antennas.

Figure 23:
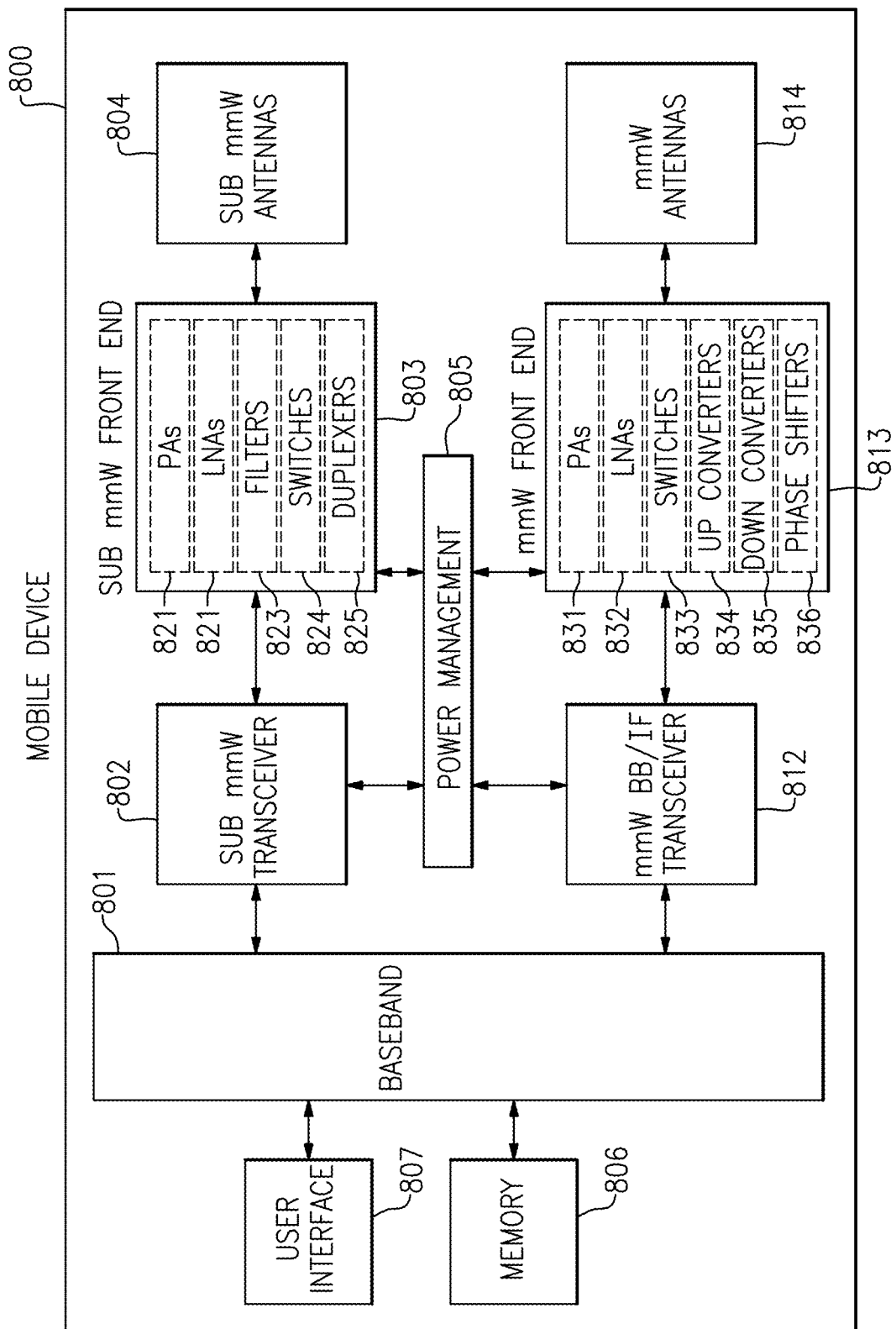
FIG. 23 is a schematic diagram of one embodiment of a mobile device.

FIG. 23 is a schematic diagram of one embodiment of a mobile device 800. The mobile device 800 includes a baseband system 801, a sub millimeter wave (mmW) transceiver 802, a sub mmW front end system 803, sub mmW antennas 804, a power management system 805, a memory 806, a user interface 807, a mmW baseband (BB)/intermediate frequency (IF) transceiver 812, a mmW front end system 813, and mmW antennas 814.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

In the illustrated embodiment, the sub mmW transceiver 802, sub mmW front end system 803, and sub mmW antennas 804 serve to transmit and receive centimeter waves and other radio frequency signals below millimeter wave frequencies. Additionally, the mmW BB/IF transceiver 812, mmW front end system 813, and mmW antennas 814 serve to transmit and receive millimeter waves. Although one specific example is shown, other implementations are possible, including, but not limited to, mobile devices operating using circuitry operating over different frequency ranges.

The sub mmW transceiver 802 generates RF signals for transmission and processes incoming RF signals received from the sub mmW antennas 804. It will be understood that various functionalities associated with the transmission and receiving of RF signals can be achieved by one or more components that are collectively represented in FIG. 23 as the sub mmW transceiver 802. In one example, separate components (for instance, separate circuits or dies) can be provided for handling certain types of RF signals.

The sub mmW front end system 803 aids is conditioning signals transmitted to and/or received from the antennas 804. In the illustrated embodiment, the front end system 803 includes power amplifiers (PAs) 821, low noise amplifiers (LNAs) 822, filters 823, switches 824, and duplexers 825. However, other implementations are possible.

For example, the sub mmW front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The sub mmW antennas 804 can include antennas used for a wide variety of types of communications. For example, the sub mmW antennas 804 can include antennas for transmitting and/or receiving signals associated with a wide variety of frequencies and communications standards.

The mmW BB/IF transceiver 812 generates millimeter wave signals for transmission and processes incoming millimeter wave signals received from the mmW antennas 814. It will be understood that various functionalities associated with the transmission and receiving of RF signals can be achieved by one or more components that are collectively represented in FIG. 23 as the mmW transceiver 812. The mmW BB/IF transceiver 812 can operate at baseband or intermediate frequency, based on implementation.

The mmW front end system 813 aids is conditioning signals transmitted to and/or received from the mmW antennas 814. In the illustrated embodiment, the front end system 803 includes power amplifiers 831, low noise amplifiers 832, switches 833, up converters 834, down converters 835, and phase shifters 836. However, other implementations are possible. In one example, the mobile device 800 operates with a BB mmW transceiver, and up converters and down-converters are omitted from the mmW front end system. In another example, the mmW front end system further includes filters for filtering millimeter wave signals.

The mmW antennas 814 can include antennas used for a wide variety of types of communications. The mmW antennas 814 can include antenna elements implemented in a wide variety of ways, and in certain configurations the antenna elements are arranged to form one or more antenna arrays. Examples of antenna elements for millimeter wave antenna arrays include, but are not limited to, patch antennas, dipole antenna elements, ceramic resonators, stamped metal antennas, and/or laser direct structuring antennas.

In certain implementations, the mobile device 800 supports MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 operates with beamforming. For example, the mmW front end system 813 includes phase shifters having variable phase controlled by the mmW BB/IF transceiver 812. Additionally, the phase shifters are controlled to provide beam formation and directivity for transmission and/or reception of signals using the mmW antennas 814. For example, in the context of signal transmission, the phases of the transmit signals provided to an antenna array used for transmission are controlled such that radiated signals combine using constructive and destructive interference to generate an aggregate transmit signal exhibiting beam-like qualities with more signal strength propagating in a given direction. In the context of signal reception, the phases are controlled such that more signal energy is received when the signal is arriving to the antenna array from a particular direction.

The baseband system 801 is coupled to the user interface 807 to facilitate processing of various user input and output (I/O), such as voice and data. The baseband system 801 provides the sub mmW and mmW transceivers with digital representations of transmit signals, which are processed by the transceivers to generate RF signals for transmission. The baseband system 801 also processes digital representations of received signals provided by the transceivers. As shown in FIG. 23, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers of the front end systems. For example, the power management system 805 can be configured to change the supply voltage(s) provided to one or more of the power amplifiers to improve efficiency, such as power added efficiency (PAE).

In certain implementations, the power management system 805 receives a battery voltage from a battery. The battery can be any suitable battery for use in the mobile device 800, including, for example, a lithium-ion battery.

CONCLUSION

Some of the embodiments described above have provided examples of beam control in connection with wireless communication devices. However, the principles and advantages of the embodiments can be used for any other systems or apparatus that benefit from any of the circuits and systems described herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A communications device for use in a cellular network, the communications device comprising:
   a plurality of signal conditioning circuits configured to generate a plurality of transmit signals;
   an antenna array including a plurality of antenna elements each thereof operatively associated with a corresponding one of the plurality of signal conditioning circuits, the antenna array configured to receive the plurality of transmit signals and to radiate a transmit beam; and
   a beam control circuit configured to control the plurality of signal conditioning circuits to provide beam steering of the transmit beam based on a direction of one or more harmonic lobes of the transmit beam.

2. The communications device of claim 1 wherein the beam control circuit is operable to steer the transmit beam based on a location of the one or more harmonic lobes relative to at least one other communications device of the cellular network.

3. The communications device of claim 2 wherein the beam control circuit is configured to receive an indicator of geo-positioning of the at least one other communications device.

4. The communications device of claim 2 wherein the beam control circuit is configured to steer the transmit beam such that the at least one other communications device is outside a beam width of each of the one or more harmonic lobes of the transmit beam.

5. The communications device of claim 1 wherein the beam control circuit is operable to regularly update a direction of the transmit beam.

6. The communications device of claim 1 wherein the beam control circuit is operable to control a strength of the transmit beam.

7. The communications device of claim 1 wherein the one or more harmonic lobes include a primary harmonic lobe pointing in substantially the same direction as a fundamental lobe of the transmit beam.

8. The communications device of claim 7 wherein the beam control circuit is operable to steer the direction of the transmit beam such that another communication device of the cellular network is inside a beam width of the fundamental lobe but outside a beam width of the primary harmonic lobe.

9. The communications device of claim 1 wherein the one or more harmonic lobes include a second harmonic lobe.

10. The communications device of claim 1 wherein the one or more harmonic lobes include a third harmonic lobe.

11. The communications device of claim 1 wherein the plurality of signal condition circuits each include a phase shifter controlled by the beam control circuit.

12. A module for implementation in a communications device of a cellular network, the module comprising:
   a laminated substrate;
   an antenna array formed on the laminated substrate and including a plurality of antenna elements, the antenna array configured to receive a plurality of transmit signals and to radiate a transmit beam; and
   a semiconductor die attached to the laminated substrate and including a plurality of signal conditioning circuits configured to generate the plurality of transmit signals, the semiconductor die further including a beam control circuit configured to control the plurality of signal conditioning circuits to provide beam steering of the transmit beam based on a direction of one or more harmonic lobes of the transmit beam.

13. The module of claim 12 wherein the beam control circuit is operable to steer the transmit beam based on a location of the one or more harmonic lobes relative to at least one other communications device of the cellular network.

14. The module of claim 13 wherein the beam control circuit is configured to receive an indicator of geo-positioning of the at least one other communications device.

15. The module of claim 13 wherein the beam control circuit is configured to steer the transmit beam such that the at least one other communications device is outside a beam width of each of the one or more harmonic lobes of the transmit beam.

16. The module of claim 12 wherein the beam control circuit is operable to steer a direction of the transmit beam such that another communication device of the cellular network is inside a beam width of a fundamental lobe of the transmit beam but outside a beam width of a primary harmonic lobe of the transmit beam.

17. A method of beam control in a communications device of a cellular network, the method comprising:
   conditioning a plurality of transmit signals using a plurality of signal conditioning circuits;
   generating a transmit beam by providing the plurality of transmit signals to a plurality of antenna elements of an antenna array, each of the plurality of antenna elements operatively associated with a corresponding one of the plurality of signal conditioning circuits; and
   controlling the plurality of signal conditioning circuits using a beam control circuit, including steering the transmit beam based on a direction of one or more harmonic lobes of the transmit beam.

18. The method of claim 17 wherein controlling the plurality of signal conditioning circuits using the beam control circuit further includes steering the transmit beam based on a location of the one or more harmonic lobes relative to at least one other communications device of the cellular network.

19. The method of claim 18 further comprising receiving an indicator of geo-positioning of the at least one other communications device as an input to the beam control circuit.

20. The method of claim 18 wherein controlling the plurality of signal conditioning circuits using the beam control circuit further includes steering the transmit beam such that the at least one other communications device is outside a beam width of each of the one or more harmonic lobes of the transmit beam.

* * * * *